US007315822B2

(12) United States Patent
Li

(10) Patent No.: US 7,315,822 B2
(45) Date of Patent: Jan. 1, 2008

(54) SYSTEM AND METHOD FOR A MEDIA CODEC EMPLOYING A REVERSIBLE TRANSFORM OBTAINED VIA MATRIX LIFTING

(75) Inventor: Jin Li, Sammamish, WA (US)

(73) Assignee: Microsoft Corp., Redmond, WA (US)

( * ) Notice: Subject to any disclaimer, the term of this patent is extended or adjusted under 35 U.S.C. 154(b) by 919 days.

(21) Appl. No.: 10/783,531

(22) Filed: Feb. 20, 2004

(65) Prior Publication Data

US 2005/0083216 A1   Apr. 21, 2005

Related U.S. Application Data

(60) Provisional application No. 60/513,006, filed on Oct. 20, 2003.

(51) Int. Cl.
*G10L 19/00* (2006.01)
*G10L 19/02* (2006.01)

(52) U.S. Cl. .................. 704/500; 704/203; 704/205

(58) Field of Classification Search ................ None
See application file for complete search history.

(56) References Cited

U.S. PATENT DOCUMENTS 6,011,824 A * 1/2000 Oikawa et al. ............. 375/377
7,275,036 B2 * 9/2007 Geiger et al. ............... 704/500

OTHER PUBLICATIONS

Huang et al., "Integer fast modified cosine transform", 2003 International Conference on Multimedia and Expo, vol. 2, Jul. 6-9, 2003. pp. 729-732.*

Prasad et al., "Analyzing Reversible Lapped Transforms using Reng Probing", Fortieth Asilomar Conference on Signlas, Systems and Computers, Oct.-Nov. 2006, pp. 873-877.*

Li, "Low noise reversible MDCT (RMDCT) and its application in progressive-to-lossless embedded audio coding", IEEE Transactions on Signal Processing, vol. 53, Issue 5, May 2005, pp. 1870-1880.*

Geiger, R., J. Herren J. Koller, and K. Brandenburg, IntMDCT—A link between perceptual and lossless audio coding, *Proc. of ICASSP 2002*, Orlando, 2002, pp. 1813-1816.

(Continued)

*Primary Examiner*—David Hudspeth
*Assistant Examiner*—Brian L. Albertalli
(74) *Attorney, Agent, or Firm*—Lyon & Harr, LLP; Katrina A. Lyon

(57) ABSTRACT

A system and method for encoding and/or decoding a signal, such as an audio signal, employing a reversible transform obtained via matrix lifting. This reversible transform not only converts integer input to integer output, but also reconstructs the exact input from the output. It is one of the key modules for lossless and progressive to lossless audio codecs. The system and method of the invention produces smaller quantization noise and better compression performance of lossless and progressive to lossless codecs previously known. A number of embodiments employing RMDCT solutions are described. Matrix lifting is used to implement a reversible fast Fourier transform (FFT) and a reversible fractional-shifted FFT, respectively, which are further combined with reversible rotations to form a RMDCT. A progressive-to-lossless embedded audio codec (PLEAC) employing RMDCT is implemented with superior results for both lossless and lossy audio compression.

39 Claims, 13 Drawing Sheets

OTHER PUBLICATIONS

Komatsu, K., and Sezaki, Reversible discrete cosine transform, *Proc. of the IEEE Int'l. Conf. on Acoustics, Speech and Signal Processing*, 1998, vol. 3, pp. 1769-1772.

Li, J., Embedded audio coding (EAC) with implicit auditory masking, ACM Multimdeia 2002, Nice, France.

Liebchen, T., M. Purat, and P. Noll, Lossless transform coding of audio signals, *102$^{nd}$ AES Convention*, Müchen, 1997.

Malvar, H. S., Lapped transform for efficient transform/subband coding, *IEEE Trans. Acoust., Speech, Signal Processing*, Jun. 1990, vol. 38, pp. 969-978.

Monkey's Audio, A fast powerful lossless audio compressor, http://www.monkeysaudio.com (Version 3.97).

Moriya, T., A. Jin, T. Mori, K. Ikeda, T. Kaneko, Lossless scalable audio coder and quality enhancement, *Proc. of the IEEE Int'l. Conf. on Acoustics, Speech and Signal Processing*, 2002, vol. 2, pp. 1829-1832.

Sound quality assessment material recordings for subjective tests, http://www.ebu.ch/CMSimages/en/tec_doc_t3253_tcm6-10525.pdf.

Sweldens, W., The lifting scheme: A new philosophy in biorthogonal wavelet constructions, Katholieke Universiteit Leuven Belgium, Dept of Computer Science.

Valens, C., The Fast Lifting Wavelet Transform, 1999.

Wang, J., J. Sun and S. Yu, 1-D and 2-D transforms from integers to integers, *Proc. of ICASSP '03*, Hong Kong, China.

Wegener, A., MUSICompress: Lossless, low-MIPS audio compression in software and hardware, *Proc. Int'l. Conf. on Signal Processing Applications and Tech.*, San Diego, CA, 1997.

\* cited by examiner

SYSTEM AND METHOD FOR A MEDIA CODEC EMPLOYING A REVERSIBLE TRANSFORM OBTAINED VIA MATRIX LIFTING

This application claims priority under 35 U.S.C. Section 119(e)(1) of provisional application No. 60/513,006 filed Oct. 20, 2003 and entitled "Reversible FFT, Fractional-shifted FFT and MDCT Implementation Via Matrix Lifting".

BACKGROUND

1. Technical Field

This invention is directed toward a system and method for encoding and decoding data. More specifically, the invention is directed toward a system and method for encoding and/or decoding data, such as, for example audio or video data, by employing a reversible transform obtained via matrix lifting.

2. Background Art

High performance audio codec brings digital music into reality. Popular audio compression technologies, such as MPEG-1 layer 3 (MP3), MPEG4 audio, Real Audio and Windows Media Audio (WMA), are lossy in nature. In these compression technologies, the audio waveform is distorted in exchange for a higher compression ratio. In quality critical applications such as a professional recording/editing studio, it is imperative to preserve the original audio. That is, the audio should be compressed in a lossless fashion. An especially attractive feature of a lossless audio codec is the progressive-to-lossless codec, where the audio is compressed into a lossless bitstream, which may be further truncated at an arbitrary point to provide a lossy bitstream of lesser bitrate without re-encoding. Thus, progressive-to-lossless media codec offers the greatest flexibility in compression. During initial encoding, the media may be compressed to lossless, which preserves all of the information of the original media. Later, if the transmission bandwidth or the storage space is insufficient to accommodate the full lossless media, the compressed media bitstream may be effortlessly truncated to whatever bitrate is desired. The state-of-the-art image compression algorithm, the JPEG 2000[1], has the progressive-to-lossless compression mode. However, no existing audio codec operates in the progressive-to-lossless mode.

A primary reason for the lack of progressive-to-lossless audio codec is due to the lack of high quality reversible transform. Most lossless audio coding approaches, such as [8][9][10], are built upon a lossy audio coder. The audio is first encoded with an existing lossy codec, then the residue error between the original audio and the lossy coded audio is encoded. The resultant compressed bitstream has two rate points, the lossy base bitrate and the lossless bitrate. It may not be scaled at other bitrate points. Since the quantization noise in the lossy coder is difficult to model, such approaches usually lead to a drop in the lossless compression efficiency. Moreover, this coding approach is also more complex, as it requires the implementation of a base coder and a residue coder. Some other approaches, e.g., [11], build the lossless audio coder directly through a predictive filter and then encode the prediction residue. The approaches may achieve good lossless compression performance. However, there is still no scalability of the resultant bitstream.

There are many existing schemes for encoding audio files. Several such schemes attempt to achieve higher compression ratios by using known human psychoacoustic characteristics to mask the audio file. A psychoacoustic coder is an audio encoder which has been designed to take advantage of human auditory masking by dividing the audio spectrum of one or more audio channels into narrow frequency bands of different sizes optimized with respect to the frequency selectivity of human hearing. This makes it possible to sharply filter coding noise so that it is forced to stay very close in frequency to the frequency components of the audio signal being coded. By reducing the level of coding noise wherever there are no audio signals to mask it, and increasing the level of coding noise wherever there are strong audio signals, the sound quality of the original signal can be subjectively preserved. Using human psychoacoustic hearing characteristics in audio file compression allows for fewer bits to be used to encode the audio components that are less audible to the human ear. Conversely, more bits can then be used to encode any psychoacoustic components of the audio file to which the human ear is more sensitive. Such psychoacoustic coding makes it possible to greatly improve the quality of an encoded audio at given bit rate.

Psychoacoustic characteristics are typically incorporated into an audio coding scheme in the following way. First, the encoder explicitly computes auditory masking thresholds of a group of audio coefficients, usually a "critical band," to generate an "audio mask." These thresholds are then transmitted to the decoder in certain forms, such as, for example, the quantization step size of the coefficients. Next, the encoder quantizes the audio coefficients according to the auditory mask. For auditory sensitive coefficients, those to which the human ear is more sensitive, a smaller quantization step size is typically used. For auditory insensitive coefficients, those to which the human ear is less sensitive, a larger quantization step size is typically used. The quantized audio coefficients are then typically entropy encoded, either through a Huffman coder such as the MPEG4 AAC quantization and coding, a vector quantizer such as the MPEG-4 TwinVQ, or a scalable bitplane coder such as the MPEG-4 BSAC coder.

In each of the aforementioned conventional audio coding schemes, the auditory masking is applied before the process of entropy coding. Consequently, the masking threshold is transmitted to the decoder as overhead information. As a result, the quality of the encoded audio at a given bit rate is reduced to the extent of the bits required to encode the auditory masking threshold information. Additionally, these audio coding schemes typically use floating point values in their calculations. Floating point arithmetic varies across platforms and thus coding schemes that use floating points are not readily transportable across these different types of platforms.

Therefore, what is needed is a system and method for encoding or decoding media data, such as, for example, audio or video data, wherein the bitstream can be scaled to whatever bitrate is desired. This system and method should be computationally efficient, while minimizing quantization noise. This encoding and decoding scheme should be portable across different types of platforms and operate in lossy and progressive-to-lossless modes.

It is noted that in the remainder of this specification, the description refers to various individual publications identified by a numeric designator contained within a pair of brackets. For example, such a reference may be identified by reciting, "reference [1]" or simply "[1]". A listing of the publications corresponding to each designator can be found at the end of the Detailed Description section.

SUMMARY

The invention is directed toward a system and method for a codec that encodes and/or decodes media, such as an audio or video signal, employing a low noise reversible transform. With matrix lifting and multiple factorization reversible rotation, the quantization noise of the reversible transform can be greatly reduced compared to other methods of encoding and decoding media data. The reversible transform can be implemented using integer arithmetic, and thus be ported across platforms, as well as scaled from lossless to any desired bitrate.

Embodiments of the system and method according to the invention use matrix lifting to implement a reversible modified discrete cosine transform (RMDCT) for audio coding. In some embodiments of the invention, this is done using a reversible Fast Fourier Transform (FFT) or a reversible fractional-shifted FFT, which are further combined with reversible rotations to form the RMDCT.

In one embodiment of the invention, an encoding system comprises a reversible transform component obtained via matrix lifting and an entropy encoder. The reversible transform component receives an input signal and provides an output of quantized coefficients corresponding to the input signal. The reversible transform component can employ, for example, a modified discrete cosine transform (MDCT), a Fast Fourier Transform (FFT) or a fractional-shifted FFT to obtain a RMDCT. This encoding system can encode data in both lossless and progressive-to-lossless modes.

Similarly, in another embodiment of the invention, a decoding system comprises an entropy decoder and an inverse reversible transform component. The entropy decoder entropy decodes the input bit stream and provides the decoded information to the inverse transform component. The inverse transform component then transforms the values from the entropy decoder and provides output values. The inverse transform component utilizes an inverse transform to essentially revert the computations in the reversible transform component of the encoder which were obtained via matrix lifting.

In yet another embodiment, a progressive-to-lossless embedded audio codec (PLEAC) employing a RMDCT obtained via matrix lifting is implemented with superior results for both lossless and lossy audio compression.

In addition to the just described benefits, other advantages of the present invention will become apparent from the detailed description which follows hereinafter when taken in conjunction with the drawing figures which accompany it.

DESCRIPTION OF THE DRAWINGS

The specific features, aspects, and advantages of the invention will become better understood with regard to the following description, appended claims, and accompanying drawings where:

FIG. 4A depicts a FMDCT via a type-IV DST; while

DETAILED DESCRIPTION OF THE PREFERRED EMBODIMENTS

In the following description of the preferred embodiments of the present invention, reference is made to the accompanying drawings that form a part hereof, and in which is shown by way of illustration specific embodiments in which the invention may be practiced. It is understood that other embodiments may be utilized and structural changes may be made without departing from the scope of the present invention.

1.0 Exemplary Operating Environment

Figure 1:
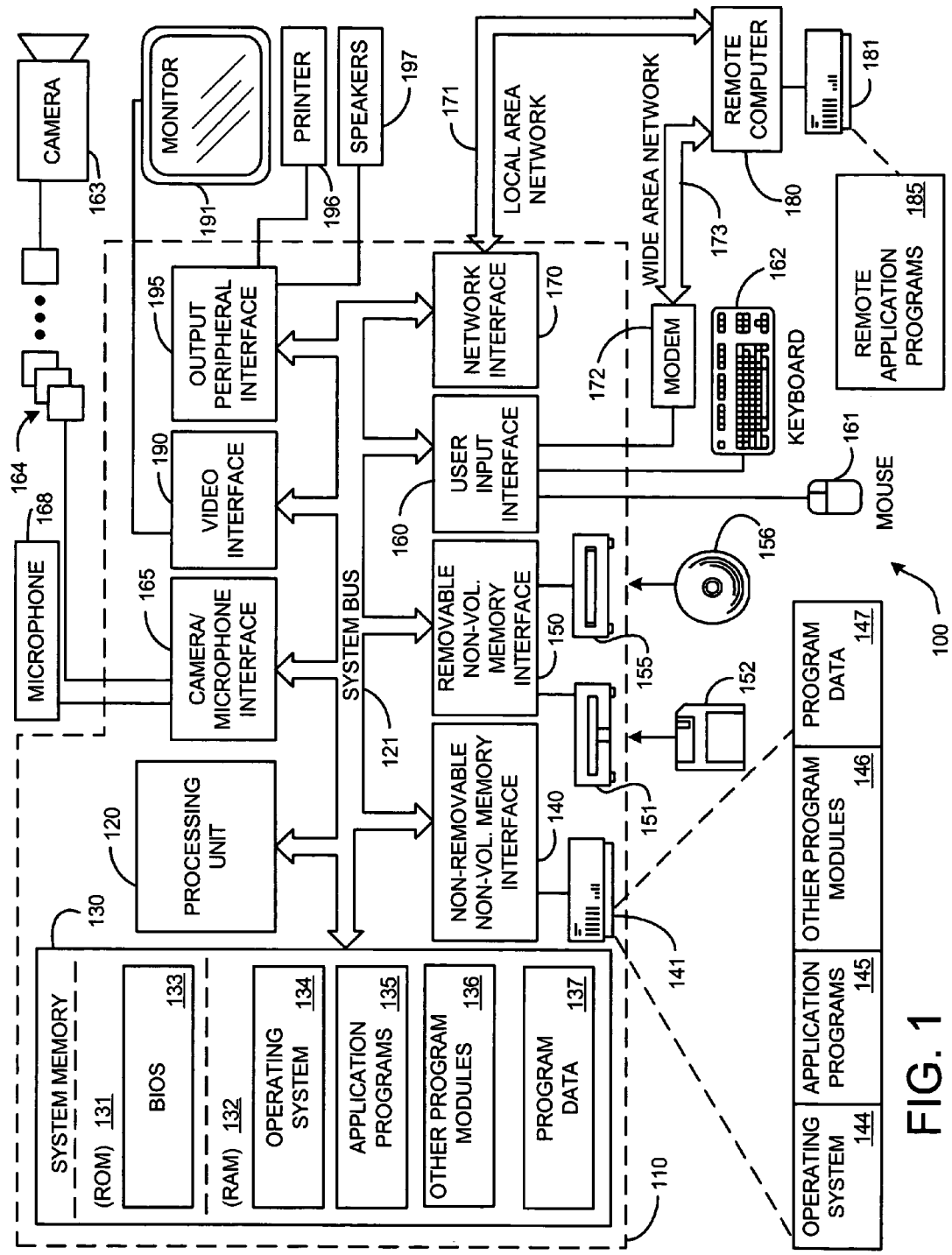
FIG. 1 is a diagram depicting a general purpose computing device constituting an exemplary system for implementing the invention.

FIG. 1 illustrates an example of a suitable computing system environment 100 on which the invention may be implemented. The computing system environment 100 is only one example of a suitable computing environment and is not intended to suggest any limitation as to the scope of use or functionality of the invention. Neither should the computing environment 100 be interpreted as having any dependency or requirement relating to any one or combination of components illustrated in the exemplary operating environment 100.

The invention is operational with numerous other general purpose or special purpose computing system environments or configurations. Examples of well known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The invention may be described in the general context of computer-executable instructions, such as program modules, being executed by a computer. Generally, program modules include routines, programs, objects, components, data structures, etc. that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

With reference to FIG. 1, an exemplary system for implementing the invention includes a general purpose computing device in the form of a computer 110. Components of computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 110 typically includes a variety of computer readable media. Computer readable media can be any available media that can be accessed by computer 110 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computer 110. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer readable media.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 1 illustrates operating system 134, application programs 135, other program modules 136, and program data 137.

The computer 110 may also include other removable/non-removable, volatile/nonvolatile computer storage media. By way of example only, FIG. 1 illustrates a hard disk drive 141 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 141 is typically connected to the system bus 121 through anon-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 1, provide storage of computer readable instructions, data structures, program modules and other data for the computer 110. In FIG. 1, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies. A user may enter commands and information into the computer 110 through input devices such as a keyboard 162 and pointing device 161, commonly referred to as a mouse, trackball or touch pad. Other input devices (not shown) may include a microphone, joystick, game pad, satellite dish, scanner, or the like. These and other input devices are often connected to the processing unit 120 through a user input interface 160 that is coupled to the system bus 121, but may be connected by other interface and bus structures, such as a parallel port, game port or a universal serial bus (USB). A monitor 191 or other type of display device is also connected to the system bus 121 via an interface, such as a video interface 190. In addition to the monitor, computers may also include other peripheral output devices such as speakers 197 and printer 196, which may be connected through an output peripheral interface 195. Of particular significance to the present invention, a camera 163 (such as a digital/electronic still or video camera, or film/photographic scanner) capable of capturing a sequence of images 164 can also be included as an input device to the personal computer 110. Further, while just one camera is depicted, multiple cameras could be included as an input device to the personal computer 110. The images 164 from the one or more cameras are input into the computer 110 via an appropriate camera interface 165. This interface 165 is connected to the system bus 121, thereby allowing the images to be routed to and stored in the RAM 132, or one of the other data storage devices associated with the computer 110. However, it is noted that image data can be input into the computer 110 from any of the aforementioned computer-readable media as well, without requiring the use of the camera 163.

The computer 110 may operate in a networked environment using logical connections to one or more remote computers, such as a remote computer 180. The remote computer 180 may be a personal computer, a server, a router, a network PC, a peer device or other common network node, and typically includes many or all of the elements described above relative to the computer 110, although only a memory storage device 181 has been illustrated in FIG. 1. The logical connections depicted in FIG. 1 include a local area network (LAN) 171 and a wide area network (WAN) 173, but may also include other networks. Such networking environments are commonplace in offices, enterprise-wide computer networks, intranets and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 1 illustrates remote application programs 185 as residing on memory device 181. It will be appreciated that the network connections shown are exemplary and other means of establishing a communications link between the computers may be used.

The exemplary operating environment having now been discussed, the remaining parts of this description section will be devoted to a description of the program modules embodying the invention.

Figure 2:
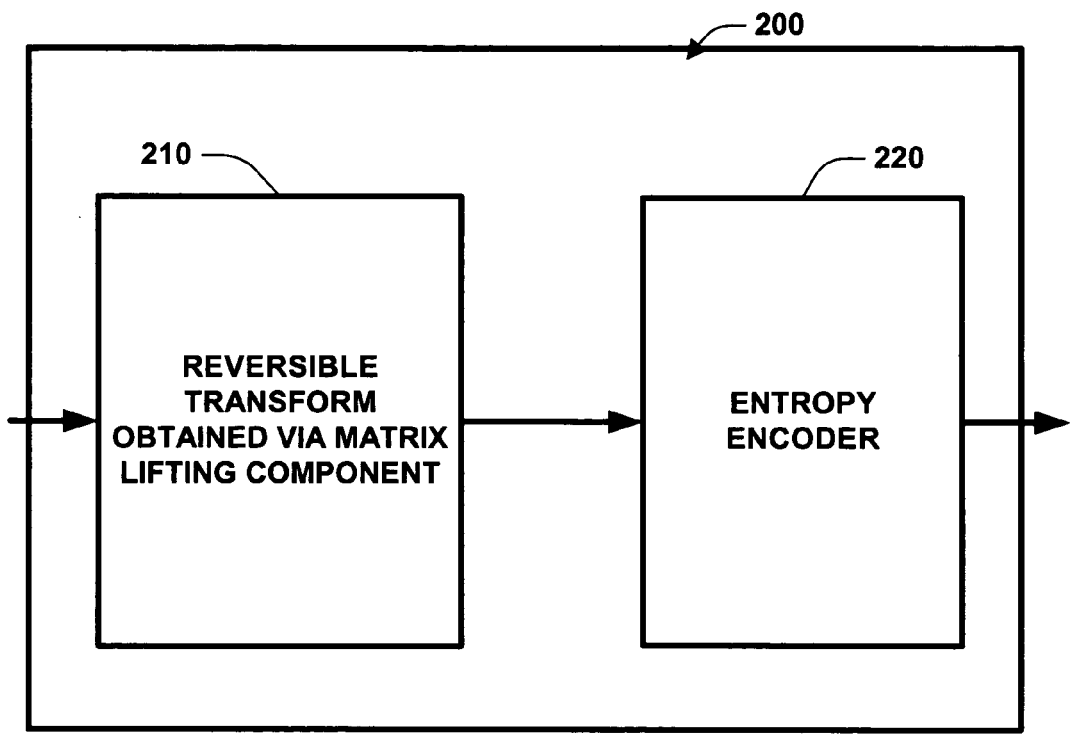
FIG. 2 is a simplified block diagram of an encoder according to the system and method according to the invention.

2.0 A System and Method for a Media Codec Employing a Reversible Transform Obtained Via Matrix Lifting The system and method according to the invention is described in detail in the following sections. However, in a most general sense, referring to FIG. 2, a data coder system 200 in accordance with an aspect of the present invention is illustrated. The encoding system 200 can encode media data, such as, for example, image and/or audio data. For instance, the system 200 can be employed in a vast array of audio and/or document image applications, including, but not limited to, digital audio systems, segmented layered image systems, photocopiers, document scanners, optical character recognition systems, personal digital assistants, fax machines, digital cameras, digital video cameras and/or video games. The encoding system comprises a reversible transform component obtained via matrix lifting 210 and an entropy encoder 220. The reversible transform component 210 receives an input integer signal and provides an output of integer coefficients corresponding to the input signal. The reversible transform component 210 can employ, for example, a modified discrete cosine transform (MDCT), a Fast Fourier Transform (FFT) or a fractional-shifted FFT to obtain a RMDCT. The encoding system can operate in lossless or progressive-to-lossless modes.

As used in this application, the term "computer component" is intended to refer to a computer-related entity, either hardware, a combination of hardware and software, software, or software in execution. For example, a computer component may be, but is not limited to being, a process running on a processor, a processor, an object, an executable, a thread of execution, a program, and/or a computer. By way of illustration, both an application running on a server and the server can be a computer component. One or more computer components may reside within a process and/or thread of execution and a component may be localized on one computer and/or distributed between two or more computers.

Figure 3:
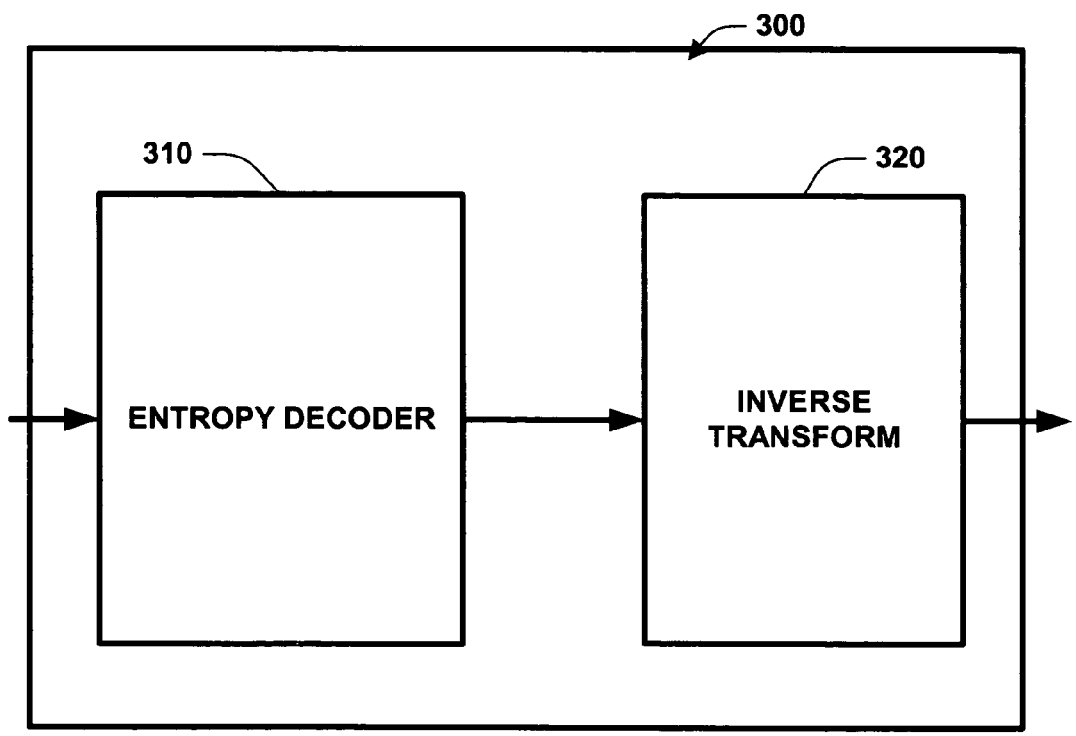
FIG. 3 is a simplified block diagram of a decoder according to the system and method according to the invention.

Referring to FIG. 3, a simplified data decoder system 300 in accordance with an aspect of the present invention is illustrated. The decoding system 300 comprises an entropy decoder 310 and an inverse transform component 320. The entropy decoder 310 entropy decodes the input bit stream and provides the decoded integer coefficients to the inverse transform component 320. The inverse transform component 320 transforms the values from the entropy decoder 310 and provides output values. The inverse transform component utilizes an inverse transform to essentially revert the computations in the reversible transform component of the encoder which were obtained via matrix lifting. The data decoder system 300, the entropy decoder 310 and/or the inverse transform component 320 can be computer components as that term is defined herein.

The following sections provide further details of the invention and the derivation thereof. Section 2.1 provides an overview of a reversible transform. The structure of a Float MDCT, a reversible MDCT and a low noise reversible rotation achieved through multiple factorizations are described in Section 2.2. Then, in Section 2.3, matrix lifting and its application to the reversible transform is described. A reversible FFT and a reversible fractional-shifted FFT are derived through the matrix lifting, and are used to implement a low noise RMDCT codec. For cross platform reversibility, the RMDCT is implemented with only the integer arithmetic. A number of integer arithmetic implementation issues are examined in Section 2.4. An exemplary progressive-to-lossless embedded audio codec (PLEAC) that incorporates the RMDCT is described in Section 2.5. Exemplary methods of coding/decoding media data according to the invention are discussed in Section 2.6. Experimental results are shown in Section 3.0.

2.1 Reversible Transforms

To develop a progressive to lossless embedded media codec, there are two key modules: a reversible transform and a lossless embedded entropy coder. The reversible transform is usually derived from the linear transform of a traditional media codec. By splitting the linear transform into a number of modules, and implementing each module with a reversible transform module, one can construct a reversible transform whose output resembles that of the linear transform, except for the rounding errors. The reversible transform establishes a one-to-one correspondence between its input and output, and converts the integer input to a set of integer coefficients. The lossless embedded entropy coder then encodes the resultant coefficients progressively all the way to lossless, often in a sub-bitplane by sub-bitplane fashion. By incorporating both modules in the media codec, one can achieve progressive-to-lossless coding. If the entire compressed bitstream is delivered to the decoder, it may exactly reconstruct the original media. If the bitstream is truncated at certain bitrate, the decoder may reconstruct a high perceptual quality media at that bitrate. The system and method of the present invention focuses on the design of the reversible transform. A number of conventional embedded entropy coders can be used with the invention.

For a transform to be reversible, it must convert integer input to integer output, and be able to exactly reconstruct the input from the output. These two properties are essential to guarantee reversibility. Nevertheless, there are other desired properties of the reversible transform. Low computational complexity is certainly one of them. Another desired property is the normalization. Consider the following two reversible transforms, which are the candidates of the stereo mixer used in the progressive-to-lossless audio codec (PLEAC):

$$\begin{cases} \text{step 1: } x' = x+y \\ \text{step 2: } y' = x-y \end{cases} \quad (1)$$

and $$\begin{cases} \text{step 1: } y' = x-y \\ \text{step 2: } x' = x - [0.5y'] \end{cases}, \quad (2)$$

where [·] is a rounding to integer operation, x and y are integer inputs, and x' and y' are integer outputs. Both transforms are reversible, however, the output of transform (1) generates a sparse output set because all points with x'+y' equal to odd are not occupied. In comparison, the output of transform (2) is dense.

One notices that if the rounding operation in (2) is removed, it will become a linear transform. In general, let a reversible transform be:

$$y = \text{rev}(x), \quad (3)$$

where x is the input integer vector, y is the output integer vector, rev( ) denotes the reversible transform operator. If all of the rounding operators in the transform are omitted, the transform can be converted into a linear transform represented with matrix multiplication:

$$y' = Mx, \quad (4)$$

where the matrix M is called the characterization matrix of the reversible transform. The characterization matrixes of the reversible transforms (1) and (2) are:

$$M_0 = \begin{bmatrix} 1 & 1 \\ 1 & -1 \end{bmatrix}, \text{ and } M_1 = \begin{bmatrix} 0.5 & 0.5 \\ 1 & -1 \end{bmatrix}, \text{ respectively.} \quad (5)$$

If X is the set of all possible input data points, the output of the reversible transform occupies a volume roughly determined by det(M)‖X‖, where ‖x‖ is the volume of the input data set, and det(M) is the determinant of matrix M. A valid reversible transform cannot have a characterization matrix with determinant det(M) smaller than 1, because such transform will compact the data, and cause multiple input integer vectors mapping to one output integer vector, which contradicts the reversibility. A reversible transform with determinant det(M) greater than 1 expands the input data set, and creates holes in the output data. It is extremely difficult to design a lossless entropy coder to deal with the holes in the output dataset, particularly if the reversible transform is complex. As a result, a desired property of the reversible transform is that the determinant of its characterization matrix det(M) is one, i.e., the reversible transform is normalized.

In audio compression, a good linear transform M is already known, which is the Float MDCT (FMDCT). This can be used to design a RMDCT whose characterization matrix is FMDCT. A common strategy of the reversible transform design is to factor the original linear transform into a series of simple modules, $$M = \prod_{i=1}^{n} M_i, \quad (6)$$

where one may find a reversible transform for each module $M_i$. For such reversible transform design, another desired property concerns the quantization noise of the reversible transform, which is the deviation of the reversible transform from the output of the linear transform of its characterization matrix:

$$e = \text{rev}(x) - Mx, \quad (7)$$

The quantization noise e results from the rounding errors of various stages of the reversible transform. This quantization noise is unavoidable, because it is the byproduct of reversibility, which forces the intermediate result and the output to be integers. The rounding error in each stage of the reversible transform can be considered as an independent random variable with no correlation with the input and output of that stage, thus the aggregated quantization noise of the reversible transform also has likewise little correlation with the input and the output. Put it in another way, the output of the reversible transform rev(x) can be considered as the sum of the output of the linear transform Mx and a random quantization noise e. Apparently, the random quantization noise increases the entropy of the output. As a result, less quantization noise leads to better lossless compression performance. Because the quantization noise also creates a noise floor in the output of the reversible transform, which reduces the audio quality in the progressive-to-lossless stage, reduction of the quantization noise improves the lossy compression performance as well. The correlation between the quantization noise level of the reversible transform and its lossless and lossy compression performance is confirmed by experiments to be discussed later. An ideal reversible transform therefore should have as low quantization noise as possible.

A FMDCT can be factored into a series of rotations. One way to derive a RMDCT is thus to convert each and every rotation into a reversible rotation, as shown in [4]. It is common knowledge that a normalized rotation can be factored into a 3-step lifting operation via:

$$\begin{bmatrix} \cos\theta & -\sin\theta \\ \sin\theta & \cos\theta \end{bmatrix} = \begin{bmatrix} 1 & \frac{\cos\theta - 1}{\sin\theta} \\ 0 & 1 \end{bmatrix} \cdot \begin{bmatrix} 1 & 0 \\ \sin\theta & 1 \end{bmatrix} \cdot \begin{bmatrix} 1 & \frac{\cos\theta - 1}{\sin\theta} \\ 0 & 1 \end{bmatrix}. \quad (8)$$

By using roundings in each of the lifting step, the rotation becomes reversible:

$$\begin{cases} \text{step 0: } z = x + [c_0 y] \\ \text{step 1: } x' = y + [c_1 z] \\ \text{step 2: } y' = z + [c_0 x'] \end{cases}, \quad (9)$$

where $c_0 = (\cos\theta - 1)/\sin\theta$ and $c_1 = \sin\theta$ are lifting parameters. Existing research on reversible DCT[3] and RMDCT[4] uses the factorization in (9) as the basic operation for the reversible transform. Though reversibility is achieved, the quantization noise of the approach (8) can be fairly large, and may lead to poor signal representation, and poor lossless and lossy compression performance.

An alternative method to obtaining a RMDCT as discussed in the paragraph above is to factor a large component of the linear transform M into upper and lower unit triangular matrixes (UTM), which are triangular matrixes with diagonal entries 1 or −1. It is shown in [11] that an even sized real matrix M with determinant of norm 1 can be factored into:

$$M = PL_1UL_2, \quad (10)$$

where P is a permutation matrix, $L_1$ and $L_2$, are lower UTMs, and U is an upper UTM. Matrixes $L_1$, $L_2$ and U can be reversibly implemented via lifting with N rounding operations, with N being the size of the matrix. The implementation of (10) leads to less rounding operations, and thus smaller quantization noise. Nevertheless, unlike a structured transform such as FFT, there is usually no structure in matrix $L_1$, $L_2$ and U, and thus there is no fast algorithm to compute the multiplication by matrix $L_1$, $L_2$ and U. The computational complexity of the UTM factorization approach is hence high.

2.2 Float Modified Discrete Cosine Transform (MDCT) and Reversible MDCT I —Reversible Rotation Through Multiple Factorizations Another method of encoding a media signal to obtain a reversible transform using reversible rotation thru multiple factorization is described in co-pending patent application Ser. No. 10/300,995 filed on Nov. 21, 2002 and entitled "A Progressive to Lossless Embedded Audio Coder (PLEAC) with Multiple Factorization Reversible Transform" by the same inventor. The idea is to develop a RMDCT from the FMDCT with low-noise reversible rotations. The float MDCT (FMDCT) can be expressed as:

$$MDCT_{2N}H_{2N}, \quad (11)$$

where $$MDCT_{2N} = \left\{ \sqrt{\frac{2}{N}} \cos\frac{\pi}{N}\left(i+\frac{1}{2}\right)\left(j+\frac{N+1}{2}\right) \right\}_{\substack{i=0,1,\cdots,N-1, \\ j=0,1,\cdots,2N-1.}} \quad (12)$$

and $H_{2N} = \text{diag }\{h(n)\}_{n=0, 1, \ldots, 2N-1}$. (13)

$MDCT_{2N}$ is the MDCT matrix, and h(n) is a window function. In MP3 audio coding, the window function h(n) is:

$$h(n) = \sin\frac{\pi}{2N}(n+0.5). \quad (14)$$

Figure 4A:
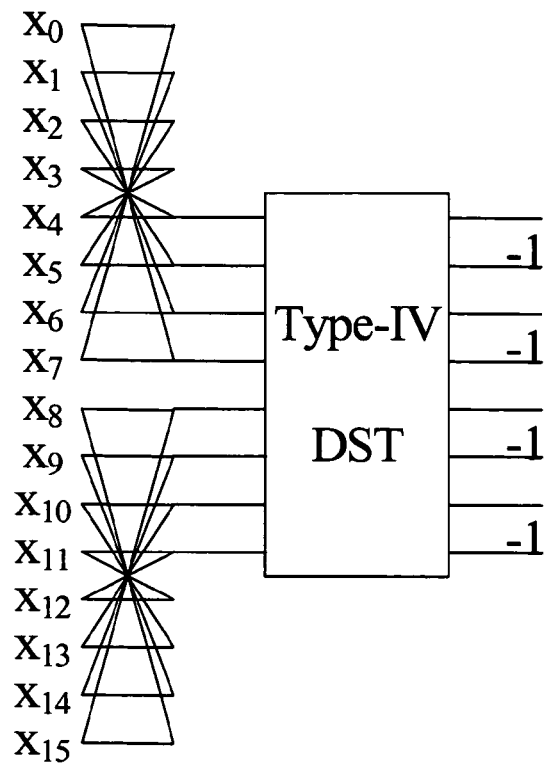

According to [12], the FMDCT can be calculated via a type-IV discrete sine transform (DST) shown in FIG. 4A. The input signal is first grouped into pairs of x(n) and x(N-n), x(N+n) and x(2N-n). Each pair is then treated as a complex number and rotated according to an angle specified by h(n). This is called the window rotation. The middle section of the signal is then transformed by a type-IV DST with:

$$DSTIV_N = \left[\sqrt{\frac{2}{N}} \sin\left(\frac{\pi}{N}(i+0.5)(j+0.5)\right)\right]_{i,j=0,1,\cdots,N-1}, \quad (15)$$

The sign of the odd index coefficients are then changed. A 2N-point type-IV DST can be further converted to an N-point complex fractional-shifted fast Fourier transform (FFT) with $\alpha=\beta=0.25$, as:

$$DSTIV_{2N} = P_{2N}F_N(0.25,0.25)Q_{2N}^{DST}P_{2N}, \quad (16)$$

where:

$$P_{2N} = [p_{i,j}], \text{ with } p_{i,j} = \begin{cases} 1 & i=j \text{ and } i \text{ is even} \\ 1 & i=2N-j \text{ and } i \text{ is odd}, \\ 0 & \text{otherwise} \end{cases} \quad (17)$$

$$Q_{2N}^{DST} = \begin{bmatrix} \begin{bmatrix} & 1 \\ 1 & \end{bmatrix} & & \\ & \ddots & \\ & & \begin{bmatrix} & 1 \\ 1 & \end{bmatrix} \end{bmatrix}. \quad (18)$$

The fractional-shifted FFT $F_N(\alpha,\beta)$ is in the form of:

$$F_N(\alpha,\beta) = \frac{1}{\sqrt{N}}\left[w_N^{(i+\alpha)(j+\beta)}\right]_{i,j=0,1,\cdots,N-1}, \text{ with } w_N = e^{-j2\pi/N} \quad (19)$$

where $\alpha$ and $\beta$ are shifting parameters, and $w_N$ is a complex rotation. Note that the fractional-shifted FFT $F_N(\alpha,\beta)$ is a complex matrix, while the other matrixes in equation (16) are real matrixes. This is interpreted by expanding every element of a complex matrix $C=[c_{i,j}]_{i,j=0, 1, \ldots, N-1}$ into a 2×2 sub-matrix of the form:

$$C = \begin{bmatrix} re_{i,j} & -im_{i,j} \\ im_{i,j} & re_{i,j} \end{bmatrix}_{i,j=0,1,\cdots,N-1}, \quad (20)$$

where $re_{i,j}$ and $im_{i,j}$ are the real and imaginary part of complex value $c_{i,j}$, respectively.

Like FFT, the fractional-shifted FFT is an orthogonal transform. This can be easily verified as the Hermitian inner product of any two vectors of the fractional-shifted FFT is a delta function:

$$\frac{1}{N}\sum_j w_N^{-(i+\alpha)(j+\beta)} \cdot w_N^{+(k+\alpha)(j+\beta)} = \frac{1}{N}w_N^{(k-i)\beta}\sum_j w_N^{(k-i)j} \quad (21)$$
$$= \delta(k-i).$$

As a corollary, the inverse of the fractional-shifted FFT is:

$$F_N^{-1}(\alpha,\beta) = \frac{1}{\sqrt{N}}\left[w_N^{-(i+\beta)(j+\alpha)}\right]_{i,j=0,1,\cdots,N-1}, \quad (22)$$

The fractional-shifted FFT can be decomposed into a pre-rotation $\Lambda_N(\alpha,0)$, FFT $F_N$ and a post-rotation $\Lambda_N(\beta,\alpha)$. The fractional-shifted FFT can thus be implemented via a standard FFT, as:

$$F_N(\alpha,\beta) = \Lambda_N(\beta,\alpha) F_N \Lambda_N(\alpha, 0), \quad (23)$$

where $$\Lambda_N(\alpha,\beta) = \mathrm{diag}\{w_N^{\alpha(j+\beta)}\}_{j=0, 1, \ldots, N-1}, \quad (24)$$

is a diagonal matrix of N rotations, and $$F_N = \frac{1}{\sqrt{N}} [w_N^{ij}]_{i,j=0,1,\cdots,N-1}, \quad (25)$$

is the standard FFT.

One notices that the matrix $P_{2N}$ and $Q_{2N}^{DST}$ are permutation matrixes and may be implemented as such in the reversible transform. To derive the RMDCT from the FMDCT above, one simply needs to turn the window rotation h(n) into the reversible rotation, and implement the fractional-shifted FFT $F_N(0.25,0.25)$ with a reversible fractional-shifted FFT.

An alternative implementation of FMDCT is to first group signal into pairs of x(n) and x(N+n), rotate them according to an angle specified by h(n), and then transform the middle section of the signal through a type-IV DCT with:

$$DCTIV_N = \left[\sqrt{\frac{2}{N}} \cos\left(\frac{\pi}{N}(i+0.5)(j+0.5)\right)\right]_{i,j=0,1,\cdots,N-1}, \quad (26)$$

Figure 4B:
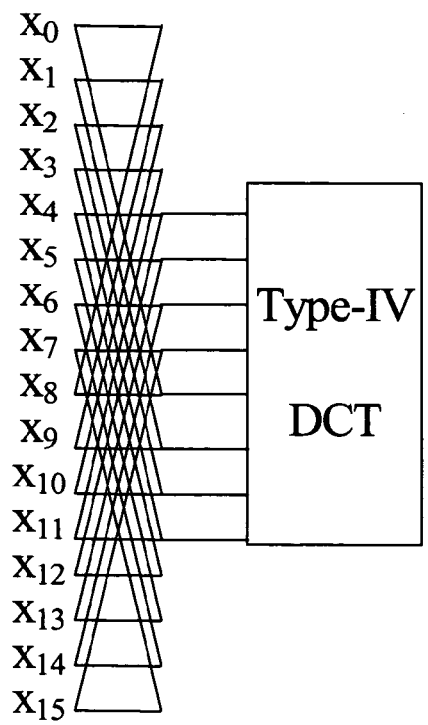
FIG. 4B depicts a FMDCT via a type-IV DCT.

The implementation can be shown in FIG. 4B. It is easily verified that a 2N-point type-IV DCT can be converted to an N-point inverse fractional-shifted FFT:

$$DCTIV_{2N} = P_{2N} F_N^{-1}(0.25,0.25) Q_{2N}^{DCT} P_{2N}, \quad (27)$$

$$\text{with } Q_{2N}^{DCT} = \begin{bmatrix} \begin{bmatrix} 1 \\ & -1 \end{bmatrix} & & & \\ & \begin{bmatrix} 1 \\ & -1 \end{bmatrix} & & \\ & & \ddots & \\ & & & \begin{bmatrix} 1 \\ & -1 \end{bmatrix} \end{bmatrix}. \quad (28)$$

With FMDCT, the two implementations of FIGS. 4A and 4B lead to the same result. However, they lead to slightly different derived reversible transforms. The FMDCT transform has other alternative forms and implementations, with different phases and window functions. Some alternative FMDCTs, termed modulated lapped transform (MLT), are shown in [12]. Nevertheless, all FMDCT and alternative forms can be decomposed into window rotations and the subsequent type-IV DST/DCT. In one case the RMDCT is derived from the FMDCT in the form of FIG. 4A. Nevertheless, the result can be easily extended to the RMDCT derived from the other FMDCT forms. For example, if an alternative form FMDCT uses the type-IV DCT implementation, one only need to implement the inverse fractional-shifted FFT $F_N^{-1}(0.25,0.25)$, instead of the forward fractional-shifted FFT.

In FIG. 4A, it is shown that the FMDCT consists of the window rotation h(n), the type-IV DST and the sign change. The type-IV DST can be implemented via a fractional-shifted FFT, which in turn consists of the pre-rotation, the FFT and the post-rotation. The FFT can be implemented via butterflies; more specifically, the 2N-point FFT can be implemented via first applying the N-point FFT on the odd and even index signal, and then combining the output via the butterfly:

$$F_{2N} = B_{2N} \begin{bmatrix} F_N & \\ & F_N \end{bmatrix} OE_{2N}, \quad (29)$$

$$\text{with } B_{2N} = \begin{bmatrix} \frac{1}{\sqrt{2}} & \frac{1}{\sqrt{2}} \\ \frac{1}{\sqrt{2}} & -\frac{1}{\sqrt{2}} \end{bmatrix} \begin{bmatrix} I_N & \\ & -\Lambda_N(0.5, 0) \end{bmatrix}$$

where $F_{2N}$ and $F_N$ are the 2N- and N-point FFT, $OE_{2N}$ is a permutation matrix that separates the 2N complex vector into the size-N vector of even indexes and the size-N vector of odd indexes, and $B_{2N}$ is the butterfly operator. Note in standard FFT([2] Chapter 12), the butterfly operator is:

$$B'_{2N} = \begin{bmatrix} 1 & 1 \\ 1 & -1 \end{bmatrix} \begin{bmatrix} I_N & \\ & -\Lambda_N(0.5, 0) \end{bmatrix}, \quad (30)$$

and a normalizing operation of $1/\sqrt{N}$ is applied after the entire FFT has been completed. However, this is not feasible in the reversible FFT, as normalizing by $1/\sqrt{N}$ is not reversible. One thus needs to adopt (29) as the basic butterfly. The matrix $$\begin{bmatrix} \frac{1}{\sqrt{2}} & \frac{1}{\sqrt{2}} \\ \frac{1}{\sqrt{2}} & -\frac{1}{\sqrt{2}} \end{bmatrix}$$

can be considered as the conjugated rotation of $-\pi/4$, and $\Lambda_N(0.5,0)$ are N complex rotations, the butterfly operation can thus be implemented as two consecutive rotations. As a result, the entire FMDCT can be implemented via a series of rotations. By implementing each and every rotation through the 3-step lifting operation of (8) and (9), one can derive one implementation of the RMDCT. The problem of such an implementation is that the quantization noise of certain rotation angles could be fairly large, which leads to large quantization noise of the RMDCT.

It is possible to factor the rotation operation with multiple forms. It is noticed that (8) is not the only form in which a reversible rotation may be factorized. There are three other factorizations of the rotation in the form of:

$$\begin{bmatrix} \cos\theta & -\sin\theta \\ \sin\theta & \cos\theta \end{bmatrix} = \begin{bmatrix} 0 & 1 \\ -1 & 0 \end{bmatrix} \begin{bmatrix} 1 & \frac{-\sin\theta-1}{\cos\theta} \\ 0 & 1 \end{bmatrix} \cdot \begin{bmatrix} 1 & 0 \\ \cos\theta & 1 \end{bmatrix}. \quad (31)$$

$$\begin{bmatrix} 1 & \frac{-\sin\theta-1}{\cos\theta} \\ 0 & 1 \end{bmatrix}$$

$$\begin{bmatrix} \cos\theta & -\sin\theta \\ \sin\theta & \cos\theta \end{bmatrix} = \begin{bmatrix} -1 & 0 \\ 0 & 1 \end{bmatrix} \begin{bmatrix} 1 & \frac{\sin\theta-1}{\cos\theta} \\ 0 & 1 \end{bmatrix} \cdot \begin{bmatrix} 1 & 0 \\ \cos\theta & 1 \end{bmatrix}. \quad (32)$$

$$\begin{bmatrix} 1 & \frac{\sin\theta-1}{\cos\theta} \\ 0 & 1 \end{bmatrix} \begin{bmatrix} 0 & 1 \\ 1 & 0 \end{bmatrix}$$

$$\begin{bmatrix} \cos\theta & -\sin\theta \\ \sin\theta & \cos\theta \end{bmatrix} = \begin{bmatrix} -1 & 0 \\ 0 & 1 \end{bmatrix} \begin{bmatrix} 1 & \frac{-\cos\theta-1}{\sin\theta} \\ 0 & 1 \end{bmatrix} \cdot \begin{bmatrix} 1 & 0 \\ \sin\theta & 1 \end{bmatrix}. \quad (33)$$

$$\begin{bmatrix} 1 & \frac{-\cos\theta-1}{\sin\theta} \\ 0 & 1 \end{bmatrix} \begin{bmatrix} 1 & 0 \\ 0 & -1 \end{bmatrix}$$

The core of the factorization is still the 3-step lifting operation of (9). However, the pair of the input/output variables may be swapped before (as in (32)) and after (as in (31)) the lifting operation. The sign of the input/output may be changed as well. The additional forms of factorization lead to different lifting parameters $c_0$ and $c_1$, for the same rotation angle $\theta$, with certain form of factorization has a lower quantization noise than the others.

In the following, the optimal factorization form for different rotation angle $\theta$ that achieves the lowest quantization noise in the mean square error (MSE) sense is selected. Let $\Delta x'$ and $\Delta y'$ be the quantization noise of the reversible rotation. The goal is to minimize the MSE: $E[\Delta x'^2]+E[\Delta y'^2]$. One notices that it is the rounding operation that introduces the quantization noise into the reversible transform. The coefficient swapping and sign changing operations do not introduce additional quantization noise. Let $\Delta$ be the quantization noise of one rounding operation:

$$[x] = x + \Delta, \quad (34)$$

One may model the quantization noise in the reversible transform as:

$$\begin{bmatrix} \Delta x' \\ \Delta y' \end{bmatrix} = \begin{bmatrix} c_1 \Delta_0 + \Delta_1 \\ (c_0 c_1 + 1)\Delta_0 + c_0 \Delta_1 + \Delta_2 \end{bmatrix} \quad (35)$$

where $\Delta_0$, $\Delta_1$ and $\Delta_2$ are the quantization noise at the lifting steps 0, 1 and 2 of equation (9), respectively. Assuming the quantization noise at each step being independent and identically distributed, with $E[\Delta^2]$ being the average energy of the quantization noise of a single rounding operation, the MSE of the quantization noise of the reversible transform can be calculated as:

$$E[\Delta x'^2] + E[\Delta y'^2] = \{(1+c_0 c_1)^2 + c_0^2 + c_1^2 + 2\} E[\Delta^2] \quad (36)$$

Figure 5:
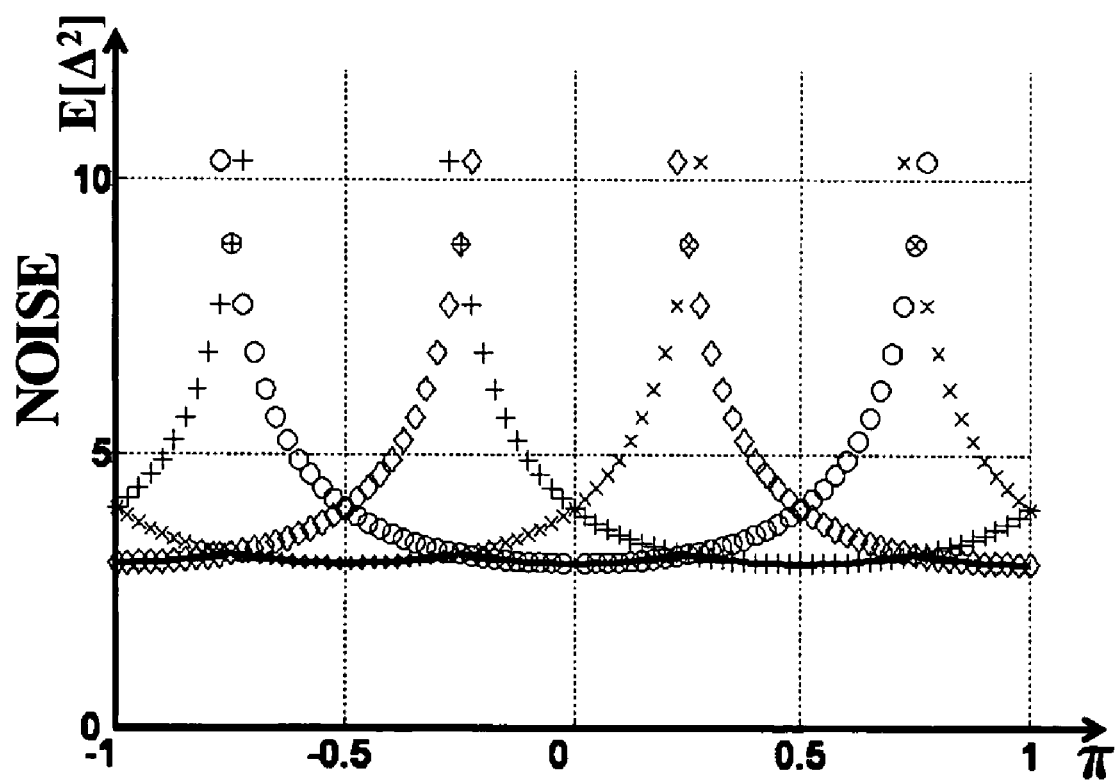
FIG. 5 depicts a graph of quantization noise versus the rotation angle of different factorization forms: the correspondence between the legend and the factorization forms are: o—(8) x—(31), +—(32) and ◊—(33). The bottom solid line is the quantization noise with the combined factorization.

The quantization noise versus the rotation angles for different factorization forms (8), (31)-(33) is plotted in FIG. 5. One observes that with any single factorization, the quantization noise can be fairly large at certain rotation angles. By switching among different factorization forms, or more specifically, by using factorization forms (8), (31), (32) and (33) for rotation angles $(-0.25\pi, 0.25\pi)$, $(-0.75\pi, -0.25\pi)$, $(0.25\pi, 0.75\pi)$ and $(0.75\pi, 1.25\pi)$, respectively, one may control the quantization noise to be at most $3.2 E[\Delta^2]$. The magnitude of $E[\Delta^2]$ depends on the rounding operation used. If one uses rounding towards the nearest integer, the average energy of the quantization noise of one rounding step is:

$$E[\Delta x^2] = \frac{1}{12}, \quad (37)$$

If rounding towards zero is used, the average energy becomes:

$$E[\Delta x^2] = \frac{1}{3}, \quad (38)$$

It is apparent that the rounding towards the nearest integer is preferred, as it generates smaller quantization noise per rounding operation.

By using the multiple factorization reversible rotation to replace each rotation in the FMDCT, one may derive a RMDCT with relatively low noise than simply using the reversible rotation of form (8). However, one can further improve upon this scheme by using matrix lifting as discussed below.

2.3 Reversible MDCT II—Matrix Lifting

In this section, as an extension to the techniques discussed above, it is shown that it is possible to derive a reversible transform to be employed with the system and method of the invention through matrix lifting, which will further lower the quantization noise over the results obtained by using multiple factorization reversible rotation alone.

2.3.1 Matrix Lifting

Theory 1: Every non-singular even sized matrix $S_{2N}$ (real or complex) of size $2N \times 2N$ can be factored into:

$$S_{2N} = P_{2N} \begin{bmatrix} I_N & \\ A_N & I_N \end{bmatrix} \begin{bmatrix} B_N & \\ & I_N \end{bmatrix} \begin{bmatrix} I_N & C_N \\ & I_N \end{bmatrix} \begin{bmatrix} I_N & \\ D_N & I_N \end{bmatrix} Q_{2N}, \quad (39)$$

where $P_{2N}$ and $Q_{2N}$ are permutation matrixes of size $2N \times 2N$, $I_N$ is the identity matrix, $A_N$, $C_N$ and $D_N$ are $N \times N$ matrixes, and $B_N$ is a non-singular $N \times N$ matrix.

Proof: Since $S_{2N}$ is non-singular, there exist permutation matrixes $P_{2N}^t$ and $Q_{2N}^t$ so that $$S_{2N} = P_{2N} \begin{bmatrix} S_{11} & S_{12} \\ S_{21} & S_{22} \end{bmatrix} Q_{2N}, \quad (40)$$

with $S_{12}$ being non-singular. Observing that:

$$\begin{bmatrix} S_{11} & S_{12} \\ S_{21} & S_{22} \end{bmatrix} \begin{bmatrix} I_N & \\ -S_{12}^{-1} S_{11} & I_N \end{bmatrix} = \begin{bmatrix} & S_{12} \\ -(S_{22} S_{12}^{-1} S_{11} - S_{21}) & S_{22} \end{bmatrix}, \quad (41)$$

by taking determinant of $S_{2N}$, and using the distributive property of the determinant, one has $$\det(S_{2N})=\det(S_{22}S_{12}^{-1}S_{11}-S_{21})\det(S_{12}). \qquad (42)$$

The matrix $s_{22}s_{12}^{-1}s_{11}-s_{21}$ is thus non-singular as well. By assigning:

$$\begin{cases} U_N = (S_{22}S_{12}^{-1}S_{11} - S_{21})^{-1} \\ A_N = (-I_N + S_{22})S_{12}^{-1} \\ B_N = S_{12}U_N^{-1} \\ C_N = U_N \\ D_N = -U_N^{-1} + S_{12}^{-1}S_{11} \end{cases}, \qquad (43)$$

One can easily verify that (39) holds.

Figure 6:
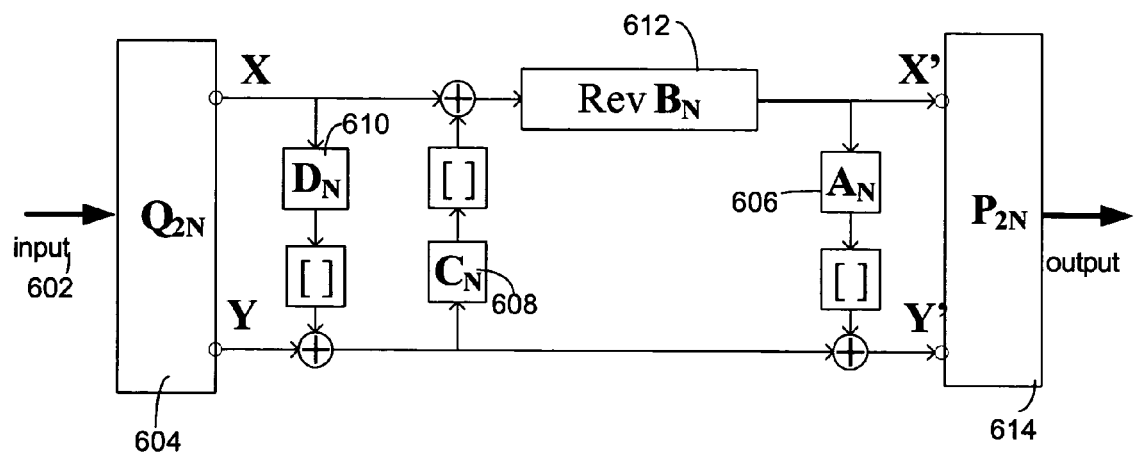
FIG. 6 depicts a forward reversible transform obtained via matrix lifting according to the present invention.

Using equation (39), one can derive a reversible transform from the linear transform of $S_{2N}$. The operation flow of the resultant reversible transform 600 can be shown in FIG. 6. The input 602 of the reversible transform is a size 2N (for real transform) or 4N (for a complex transform, as each complex consists of an integer real part and an integer imaginary part) integer vectors. After the permutation operation $Q_{2N}$ 604 it is split into two size N (real) or size 2N (complex) integer vectors X and Y, which are transformed through:

$$\begin{cases} Y_1 = Y + [D_N X] \\ X_1 = X + [C_N Y] \\ X' = \text{rev}B_N(X_1) \\ Y' = Y_1 + [A_N X] \end{cases}, \qquad (44)$$

where $A_N$ 604, $C_N$ 606 and $D_N$ 608 are float transforms and [x] represents a vector rounding operation in which the float intermediate vector x is rounded to an integer vector. Under the Cartesian coordinate, [x] can be implemented via rounding every element of x. For a complex vector of x, one may individually round the real and imaginary part of every element of x. Rev $B_N$ 612 is a reversible transform to be derived from the linear non-singular transform $B_N$. Finally, another permutation operation $P_{2N}$ 614 is applied on the resultant integer vectors X' and Y'. Because each of the above operations can be exactly reversed, the entire transform is reversible.

Figure 7:
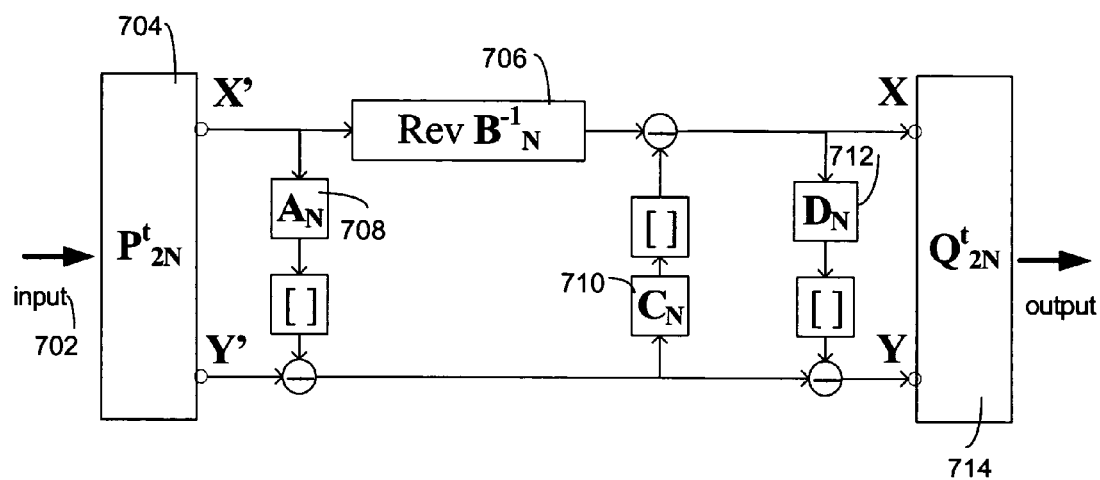
FIG. 7 depicts an inverse reversible transform obtained via matrix lifting according to the present invention.

The inverse of the transform is shown in FIG. 7. In this case, the permutation operation $P_{2N}^t$ 704 is performed on the input 702. After the permutation operation $P_2N^t$ 704, integer vectors X' and Y' are transformed to integer vectors x and Y through the inverse transform Rev $B^{-t}_N$ 706, where $A_N$ 708, $C_N$ 710 and $D_N$ 712 are float transforms. Finally, another permutation operation $Q_{2N}^t$ 714 may be applied.

Each operation in (44) is called matrix lifting, because it bears similarity to the lifting used in (9), except that the multiplication operation now is a matrix multiplication, and the rounding operation is a vector rounding. Note that this approach is different from the approach of [11], where matrix $S_{2N}$ is factored into UTM matrices, each row of which is still calculated via scalar lifting. Matrix lifting with real-values is used in constructing wavelet [5][7] and DCT-IV transforms[6]. In the system and method of the invention a matrix lifting of the complex transform is developed, and used a systematic way in constructing the wavelet transform.

Examining the matrix lifting operation, one notices that it operates on two integer vectors of equal size. During the matrix lifting operation, one of the integer vector is kept untouched. This fixed vector also goes through a certain float transform with the resultant vector being rounded. The rounded vector is then added to or subtracted from the second vector. The above operation can be reversed by flipping the addition and subtraction operation. Thus, all matrix lifting operation is reversible.

Using different permutation matrixes $P_{2N}$ and $Q_{2N}$, one may derive different forms of the reversible transforms from the linear transform $S_{2N}$ with different lifting matrixes $A_N$, $C_N$ and $D_N$ and the reversible core $B_N$. The trick is to select the permutation matrixes $P_{2N}$ and $Q_{2N}$ SO that:

a) The reversible core $B_N$ is as simple as possible. In the best case scenarios, the reversible core $B_N$ consists of only permutations. In the sub-optimal case, as in the reversible FFT, the reversible core $B_N$ consists of reversible rotations, which can be implemented via O(N) lifting steps. If simple reversible core $B_N$ can be found, one may derive a reversible transform with O(N) rounding operations from a linear transform of size N. Compared to turning every small module, e.g., rotation, into the reversible rotation, which requires O(NlogN) roundings, the matrix lifting may greatly reduce the number of rounding operations required in the reversible transform, and lower the quantization noise of the reversible transform.

b) The computation complexity of the transforms $A_N$, $C_N$ and $D_N$ is as low as possible.

2.3.2 Reversible FFT via Matrix Lifting

The following section derives the reversible FFT with the matrix lifting tool. Inspired by the radix-2 FFT of (29), a 2N-point FFT can be factored into:

$$F_{2N} = \begin{bmatrix} \frac{1}{\sqrt{2}}F_N & \frac{1}{\sqrt{2}}\Lambda_N(0.5, 0)F_N \\ \frac{1}{\sqrt{2}}F_N & -\frac{1}{\sqrt{2}}\Lambda_N(0.5, 0)F_N \end{bmatrix} OE_{2N}, \qquad (45)$$

Setting $P_{2N}=I_{2N}$, $Q_{2N}=OE_{2N}$ and using (39), matrix $F_{2N}$ can be factorized into the matrix lifting form of (39), with:

$$\begin{cases} A_N = -\sqrt{2}\, F_N^T \Lambda_N(-0.5, 0) - I_N, \\ B_N = -\Lambda_N(0.5, 0)F_N F_N = -\Lambda_N(0.5, 0)T_N, \\ C_N = -\frac{1}{\sqrt{2}}F_N^T, \\ D_N = (\sqrt{2}\, I_N + F_N^T \Lambda_N(-0.5, 0))F_N. \end{cases} \qquad (46)$$

In (46), $F_N^t$ is the inverse FFT, $T_N$ is a permutation matrix in the form of:

$$T_N = \begin{bmatrix} 1 & & & \\ & & & 1 \\ & & \iddots & \\ & 1 & & \end{bmatrix}. \qquad (47)$$

The reversible core $B_N$ is a permutation $T_N$ followed by N rotations $\Lambda_N(0.5,0)$, which can be implemented via the multiple factorization reversible rotation developed in Section 2.2. The float transform $A_N$ consists of an inverse FFT, N rotations, and a vector addition (Scale by $\sqrt{2}$ can be rolled into either the FFT or the rotation operations $\Lambda_N(\alpha,\beta)$, with no additional complexity required). Transform $C_N$ is an inverse FFT. The transform $D_N$ consists of a forward FFT, an inverse FFT and N rotations. An N-point reversible FFT (with 2N input integers, as each input is complex with real and imaginary parts) can thus be implemented via (46), with the computation complexity being four N/2-point complex FFT, N float rotations, and N/2 reversible rotations. It requires 4.5N roundings, with N roundings being used after each matrix lifting $A_N$, $C_N$ and $D_N$, and 1.5N roundings being used in the N/2 reversible rotations in $B_N$. Comparing with using reversible rotation to directly implement the reversible FFT, which requires O(NlogN) roundings, the matrix lifting approach greatly reduces the number of rounding operations.

2.3.3 Reversible Fractional-Shifted FFT via the Matrix Lifting

One may implement the RMDCT with the reversible FFT developed above. Yet, there is even simpler implementation of the RMDCT. Observing that the type-IV DST, which is the most important component of the FMDCT, is directly related with the fractional shifted FFT $F_N(\alpha,\beta)$ with $\alpha=\beta=0.25$ through (16), one may derive a reversible fractional-shifted FFT directly with matrix lifting. One notices that the fractional shifted FFT with $\alpha=\beta$ has following properties:

$$R_N(\alpha) = F_N(\alpha,\alpha)\Lambda_N(-2\alpha,\alpha)F_N(\alpha,\alpha), \quad (48)$$

where $R_N(\alpha)$ is a permutation matrix with only the element $(0,0)$ and elements $(i, N-i)$, $i=1, \ldots, N-1$ being non-zero.

The proof is rather straight forward. Let $R_N(\alpha)=[r_N(i,k)]_{i,k=0,1,\ldots,N-1}$, the element of $R_N(\alpha)$ may be calculated through matrix rotation as:

$$r_N(i,k) = \frac{1}{N}\sum_{j=0}^{N-1} W_N^{(i+\alpha)(j+\alpha)} W_N^{(-2\alpha)(j+\alpha)} W_N^{(j+\alpha)(k+\alpha)} \quad (49)$$

$$= \frac{1}{N}\sum_{j=0}^{N-1} W_N^{(i+k)(j+\alpha)}$$

$$= W_N^{(i+k)\alpha}\delta((i+k)\bmod N).$$

Thus, one has:

$$R_N(\alpha) = \begin{bmatrix} 1 & & & \\ & & & W_1^\alpha \\ & & \cdot^{\cdot^{\cdot}} & \\ & W_1^\alpha & & \end{bmatrix} \quad (50)$$

To derive the reversible transform from the fractional-shifted FFT with $\alpha=\beta=0.25$, one again uses the radix-2 FFT structure. Noticing (49), one factors the fractional shifted FFT as follows:

$$F_{2n}(\alpha,\beta) = K_{2N}S_{2N}OE_{2N}, \quad (51)$$

with:

$$K_{2N} = \begin{bmatrix} \Lambda_N((1+\beta)/2-\alpha,\alpha) & \\ & W_2^\beta \Lambda_N((1+\beta)/2-\alpha,\alpha) \end{bmatrix}, \quad (52)$$

$$\text{and } S_{2N} = \begin{bmatrix} \frac{1}{\sqrt{2}}\Lambda_N\left(-\frac{1}{2},\alpha\right)F_N(\alpha,\alpha) & \frac{1}{\sqrt{2}}F_N(\alpha,\alpha) \\ \frac{1}{\sqrt{2}}\Lambda_N\left(-\frac{1}{2},\alpha\right)F_N(\alpha,\alpha) & -\frac{1}{\sqrt{2}}F_N(\alpha,\alpha) \end{bmatrix}. \quad (53)$$

Substitute $\alpha=0.25$ and expanding the fractional-shifted FFT via (23), one factors the transform $S_{2N}$ into the matrix lifting form of (39), with:

$$\begin{cases} A_N = -\sqrt{2}\Lambda_N(-0.25, 0.25)F_N^T\Lambda_N(-0.25, 0) - I_N, \\ B_N = -R_N(0.25) = \begin{bmatrix} -1 & & & \\ & & & j \\ & & \cdot^{\cdot^{\cdot}} & \\ & j & & \end{bmatrix}, \\ C_N = -\frac{1}{\sqrt{2}}\Lambda_N(-0.25, 0.25)F_N^T\Lambda_N(0.25, 0.5), \\ D_N = \Lambda_N(-0.25, 0.25)(\sqrt{2} + F_N^T\Lambda_N(-0.5, 0.125))F_N\Lambda_N(0.25, 0). \end{cases} \quad (54)$$

In (54), the reversible core $B_N$ is simply permutation, as multiplying by $j$ just swaps the real and imaginary part and changes the sign of the imaginary part. The reversible fractional-shifted FFT of $\alpha=\beta=0.25$ is thus the matrix lifting of (54) plus the post reversible rotations of $K_{2N}$, which again can be implemented via the multiple factorization rotations described in Section 2.3. Using (54), an N-point RMDCT can be implemented via N/2 reversible window rotations of $h(n)$, a reversible matrix lifting of $S_{N/2}$, and N/2 reversible rotations of $K_{N/2}$ (noticing that the N-point FMDCT consists of an N-point type-IV DST, which can be further converted to an N/2-point fractional-shifted FFT). The total computational complexity is N reversible rotations, four N/4-point float FFTs, and 1.75N float rotations. The implementation complexity is about double of an FMDCT, which requires two N/4-point FFTs and 1.5N float rotations. Altogether, the RMDCT requires 4.5N roundings, with three 0.5N roundings after each matrix lifting of (54), and 3N roundings for the N reversible rotations.

2.4 Reversible MDCT: the Integer Arithmetic

Most operations of the reversible transform, e.g., the add/subtract operation in the lifting, the permutation, and the sign change operation, are integer operations. The only place that requires the float operation is in the lifting, where the input integer value (vector) is multiplied by a float value (or transformed through a float matrix), and then rounded. The lifting operation can certainly be implemented via the float arithmetic, e.g., with double precision, which provides high precision and large dynamic range. However, the float arithmetic is inconsistent across machines, and therefore, reversibility can not be guaranteed across platforms. Moreover, the float arithmetic is also more complex. Since the float result is ultimately rounded after the lifting, high precision float operation is not essential in the reversible transform. The float operation of the reversible transform may thus be implemented with the integer arithmetic by representing both the input, result and the transform coefficients with fixed-point integer, which is represented in the computer as a single integer.

To implement the lifting operation with the integer arithmetic, each operand of the float operation is interpreted as a fixed precision float number:

$$\pm b_n b_{n-1} \ldots b_1.a_1 a_2 \ldots a_m, \quad (55)$$

where m is the number of bits of the fractional part, and n is the number of bits of the integer part. The representation in (55) requires a total of n+m+1 bits (with one bit for sign). The variable n controls the dynamic range, and m controls the amount of quantization noise introduced by the fixed-point arithmetic. A fixed precision float in (55) may represent values with absolute magnitude up to $2^n - 2^{-m}$, and with precision down to $2^{-m}$. To perform a float operation:

$$y = w \cdot x, \quad (56)$$

where x is the input, y is the output, and w is the multiplication value, the following operations are performed. Assuming that the input and output x and y are represented with $n_x$ bit dynamic range and $m_x$ bit precision, and the transform coefficient/multiplication value w is represented with $n_w$ bit dynamic range and $m_w$ bit precision, one may treat x, y and w as integer values, perform the multiplication, and then round the result by $m_w$ bits.

Figure 8:
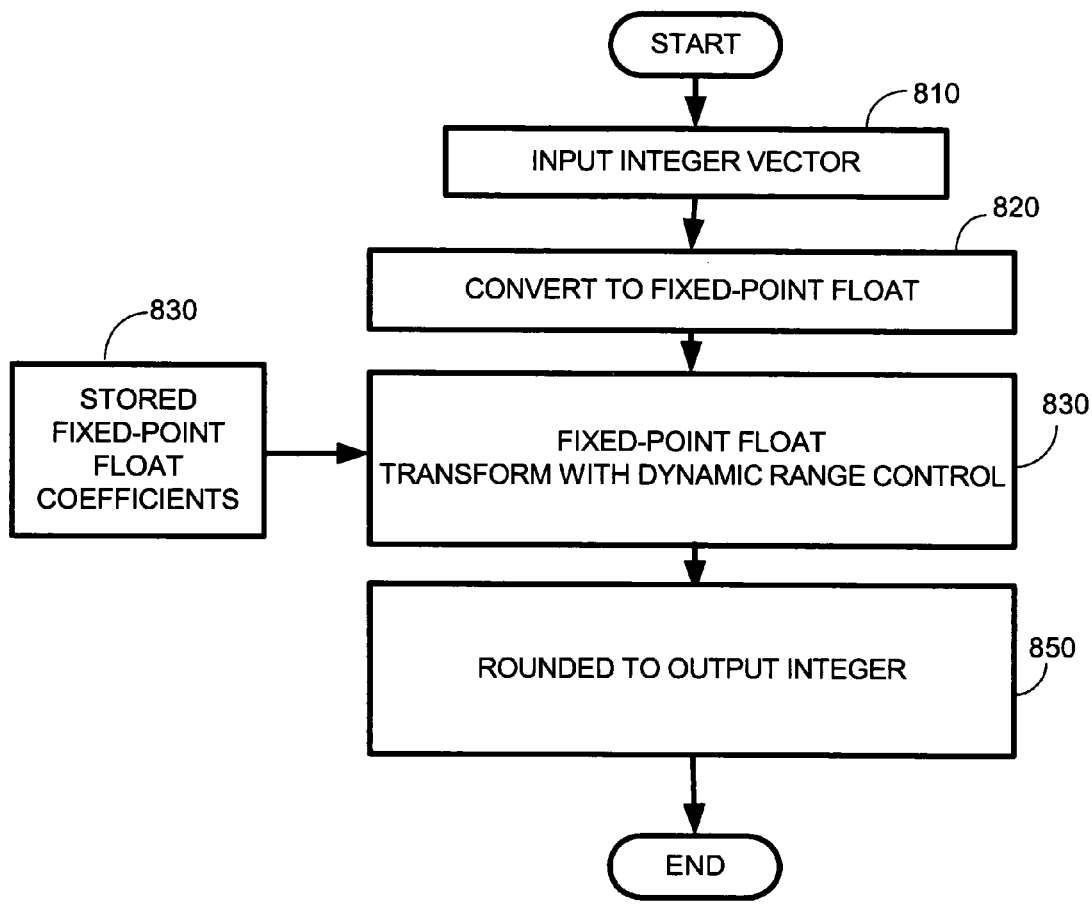
FIG. 8 depicts a flow diagram of a process of using fixed-point float to implement matrix lifting according to the present invention.

The operations of using fixed-precision float to implement the matrix lifting can be shown in FIG. 8. First, the integer input vector is converted to the fixed-point float representation (process actions 810, 820) by left shifting the input vector by a fixed number of bits (m bits in above). Next, a fixed-precision float transform is performed on the input using stored fixed-point float coefficients (process actions 830, 840). The stored fixed-point float coefficients are the parameters of the matrix lifting, e.g., the content of matrix $A_N$, $C_N$, and $D_N$ in equation (44). Finally, the output fixed-point result is rounded to integer, as shown in process action 850. The rounding operation is performed by right shifting the resultant vector by m bits and compensating the carry-over bits. The assemble code to perform the rounding operation can be shown as:

```
{
        SHR     [x], m;
        ADC     [x], 0;
}
```

Where [x] is the fixed-precision float that is to be rounded.

The key of the fixed-point implementing of the matrix lifting is to make sure that the intermediate result does not overflow, i.e., goes out of the dynamic range allowed by the fixed-point float representation, and to keep the additional quantization noise caused by the fixed-point arithmetic negligible compared to the quantization noise of the rounding operation.

Figure 9:
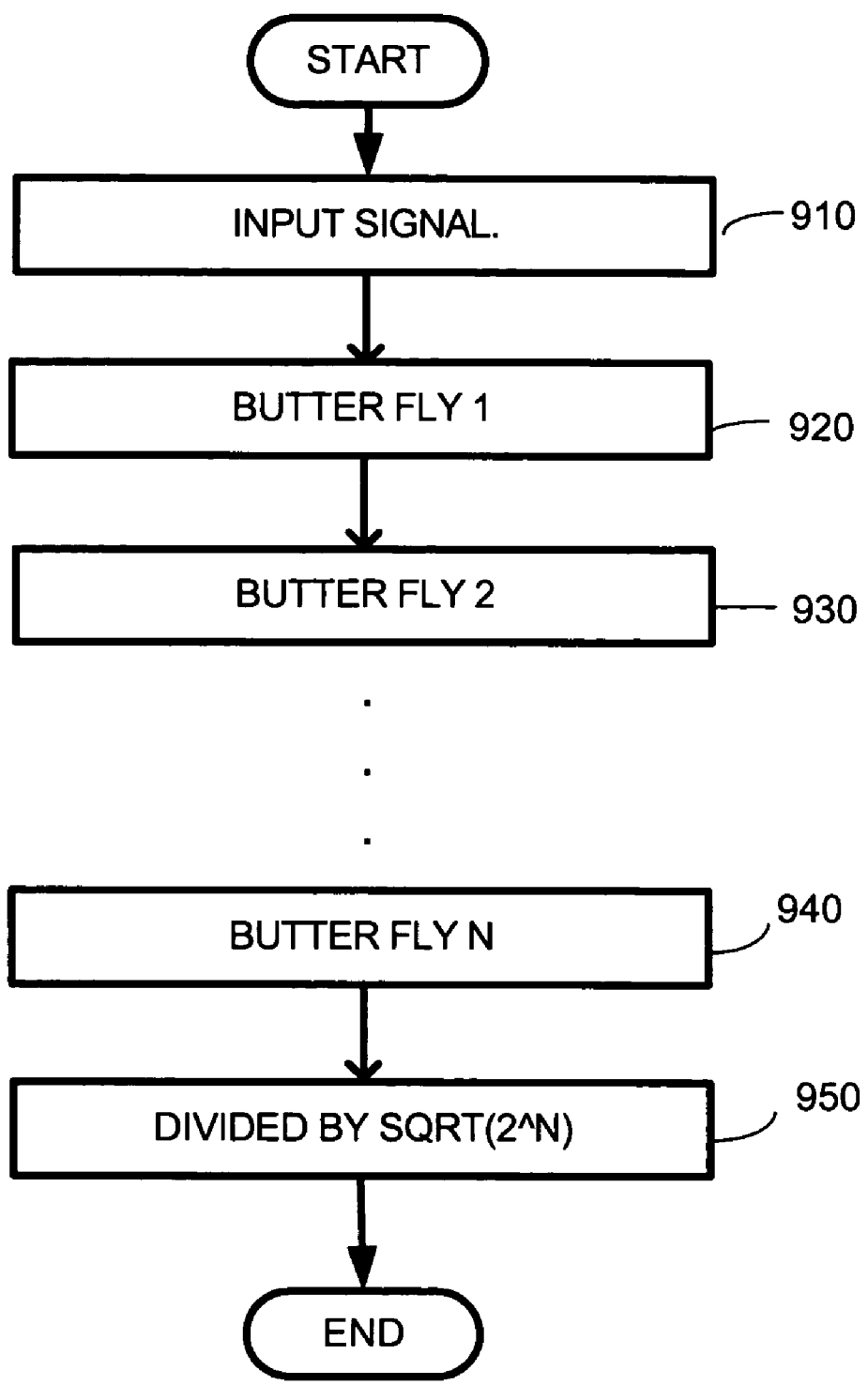
FIG. 9 depicts a flow diagram of a traditional implementation of a normalized FFT wherein a scaling operation is performed after the group of butterfly operations.
Figure 10:
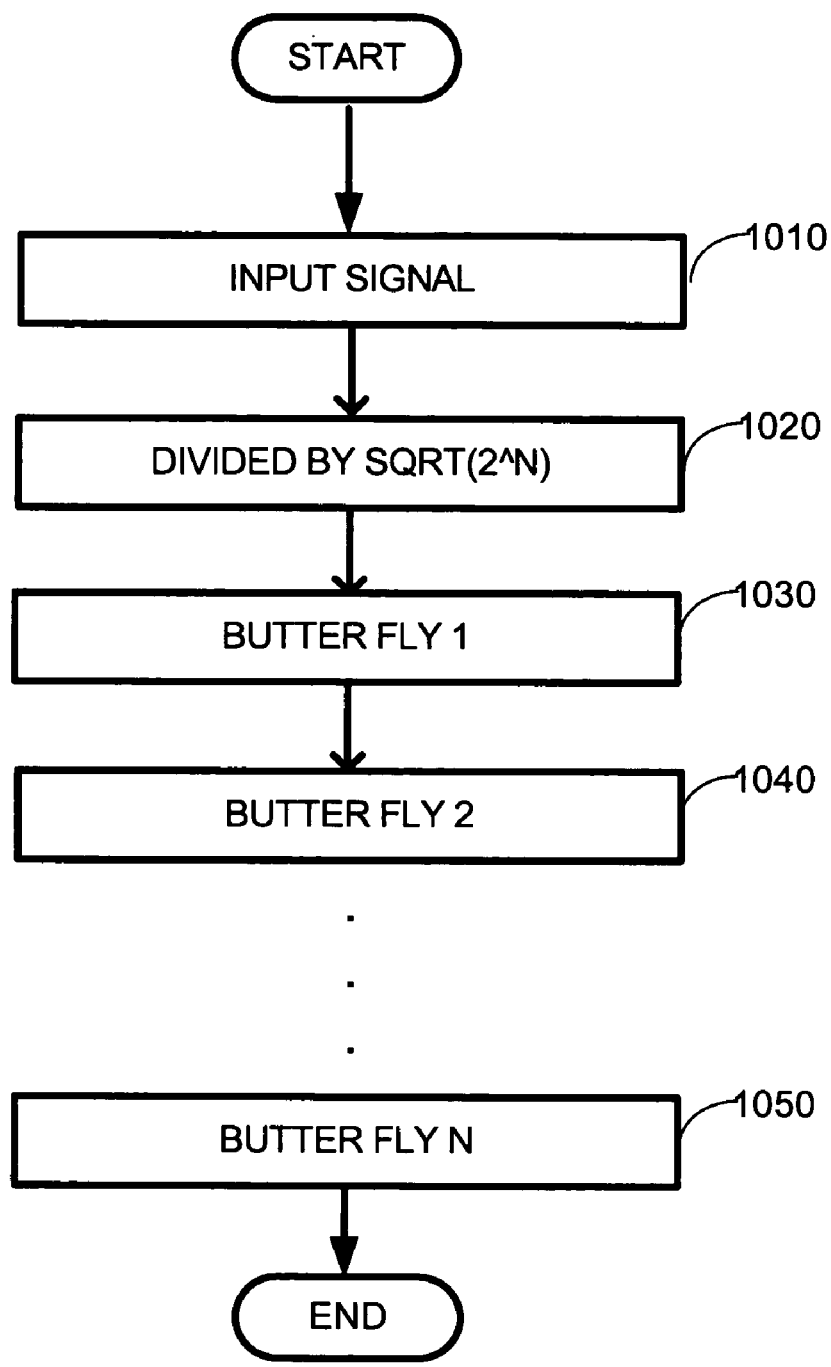
FIG. 10 depicts a flow diagram of a traditional implementation of a normalized FFT wherein a scaling operation is performed before the group of butterfly operations.
Figure 11:
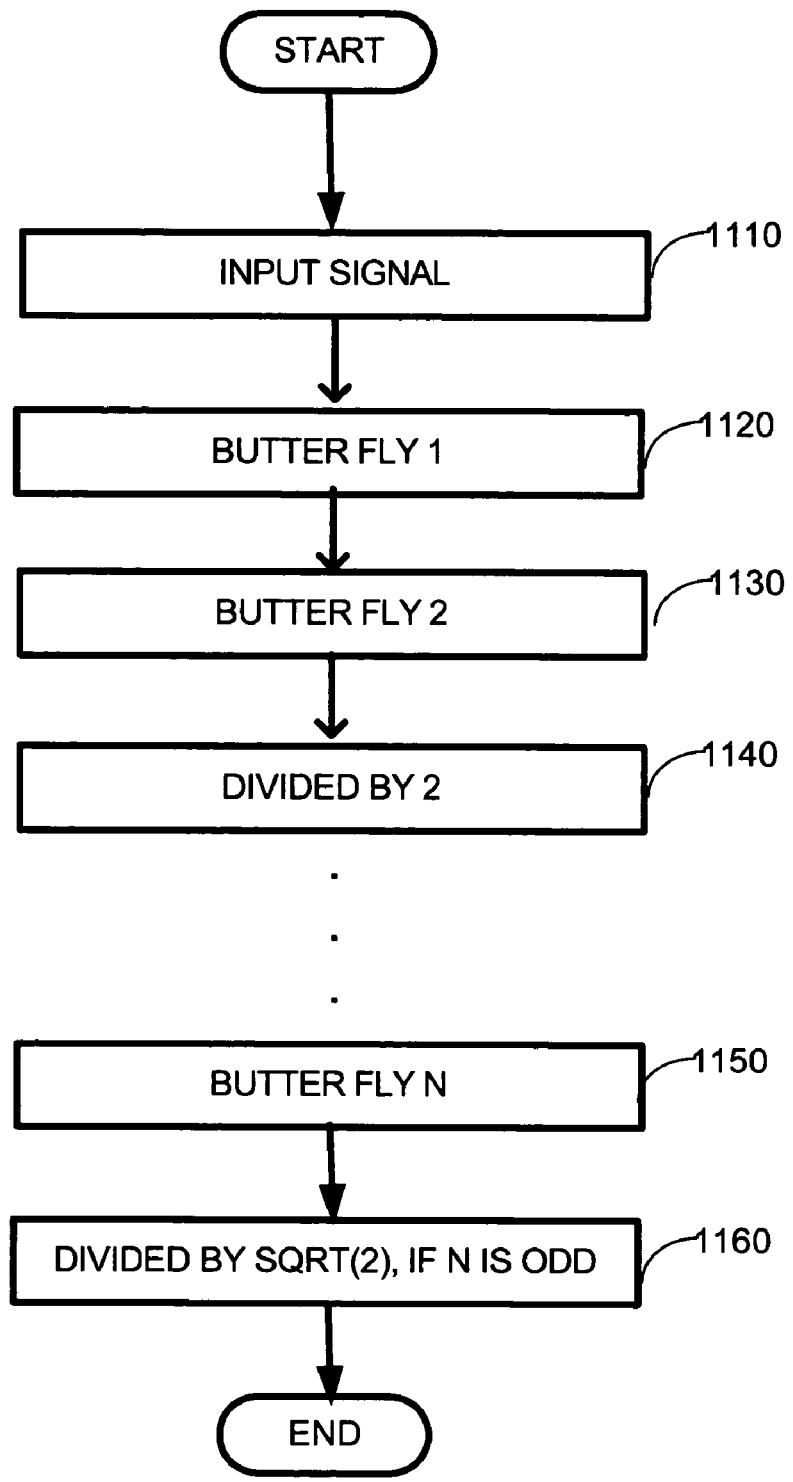
FIG. 11 depicts a flow diagram of an implementation of a normalized FFT according to the present invention.

The system and method of the invention also employs a special procedure to reduce the dynamic range required for the FFT transform used in the matrix lifting. Traditional implementation of a normalized FFT can be shown in FIG. 9 or FIG. 10. Referring to FIG. 9, after the signal is input (process action 910), $2^N$ point FFT is implemented through N stages of a butterfly operation of equation (30) (process actions 920, 930, 940). A scaling by dividing $2^{N/2}$ operation is performed either after (in FIG. 9) or before (in FIG. 10, process action 1020) the group of butterfly operations. However, performing the scaling operation after the group of butterfly operations, as in FIG. 9, requires an additional N/2 bits to accommodate the increase of the dynamic range during the FFT operation. Performing the scaling operation before the group of butterfly operations, as in FIG. 10, increases the quantization noise of the fixed-point FFT implementation, and is also unfavorable. In the present invention, the FFT implementation shown in FIG. 11 was adopted. A division by 2 operation (process action 1140) was inserted after each two butterfly operations (process actions 1120, 1130). A final division by $2^{1/2}$ operation is performed if the number of butterfly stages N is odd (process action 1160). In this way, the precision of the fixed-point FFT implementation is maximized while not increasing the dynamic range of the implementation. The final division by $2^{1/2}$ operation is usually combined with other float transforms, so it usually does not need a separate processing step.

The only component left to find is the required dynamic range and bit precision of the input, the output, and the transform coefficient. These parameters may be derived empirically. First, the dynamic range and bit precision needed to represent the transform coefficient are investigated, which in RMDCT, is mainly the rotation angle $W_N^i$. The rotation can be implemented either via a 2×2 matrix multiplication, where the values cos θ and sin θ are used, or via a 3-step multiple factorization lifting developed in Section 2.3, where the values $c_0 = (\cos \theta - 1)/\sin \theta$ and $c_1 = \sin \theta$ are used. In the multiple factorization reversible rotation, the absolute value of $C_0$ can reach 2.414, which needs $n_w = 2$ bit dynamic range. Thus, if the transform coefficient is represented with a 32 bit integer, it can have a bit precision of at most $m_w = 29$ bits.

To illustrate the impact of the bit precision of the transform coefficient on the quantization noise level of the reversible transform, the magnitude of the quantization noise of the RMDCT versus that of the FMDCT is measured, under different bit precisions of the transform coefficients. The quantization noise is measured in terms of the mean square error (MSE), the mean absolute difference (MAD) and the peak absolute difference (PAD), where $$MSE = \frac{1}{N} \sum_{i=0}^{N-1} (y_i' - y_i)^2, \quad (57)$$

$$MAD = \frac{1}{N} \sum_{i=0}^{N-1} |y_i' - y_i|, \quad (58)$$

$$\text{and } PAD = \max_i |y_i' - y_i|. \quad (59)$$

In the above, $y_i$ is the FMDCT coefficient, and $y'_i$ is the RMDCT coefficient. The result can be shown in Table 4. The RMDCT in use is derived via the fractional-shifted FFT of Section 2.3.3. In the second column of Table 4 the quantization noise level of the RMDCT implemented via the float arithmetic is shown. Then, in the following columns the quantization noise level of the RMDCT implemented via the integer arithmetic is shown, with the bit precision of the transform coefficients $m_w$ being 29, 20, 16 and 12 bits. It is observed that with a bit precision above 16 bits, the RMDCT implemented via the integer arithmetic has a quantization noise level very close to that of the float arithmetic. Less bit precision significantly increases the quantization noise level of the reversible transform, as there is not enough accuracy to correctly represent the multiplicative value/transform coefficient. The bit precision for the transform coefficient $m_w$ is chosen to be 29 bits, as this still allows the transform coefficient to be represented with 32 bit integer. For the other three bits, two bits are used for the dynamic range of the transform coefficients ($n_w=2$), and one bit is used for the sign.

TABLE 1

Bit precision of the transform coefficient $m_w$.

| Precision | Float arithmetic | $m_w = 29$ | 20 | 16 | 12 |
|---|---|---|---|---|---|
| MSE | 0.47 | 0.47 | 0.48 | 0.49 | 5.94 |
| MAD | 0.53 | 0.53 | 0.54 | 0.54 | 1.18 |
| PAD | 11.86 | 11.86 | 11.86 | 11.86 | 286.56 |

Next, the bit precision $m_x$ required to represent the input and output of the matrix lifting operations is investigated. Again, the quantization noise level of the RMDCT versus that of the FMDCT is compared, with different bit precisions of the input and output. The result is shown in Table 2. It is evident that the quantization noise level starts to increase with less than $m_x=5$ bits to represent the intermediate result of the float transform.

TABLE 2

Bit precision of the input/output of the matrix lifting $m_x$.

| Precision | float arithmetic | $m_x = 9$ | 5 | 4 | 3 | 2 | 1 | 0 |
|---|---|---|---|---|---|---|---|---|
| MSE | 0.47 | 0.47 | 0.48 | 0.51 | 0.60 | 0.98 | 2.47 | 8.08 |
| MAD | 0.53 | 0.53 | 0.54 | 0.55 | 0.58 | 0.69 | 0.98 | 1.73 |
| PAD | 11.86 | 11.86 | 11.86 | 10.86 | 10.02 | 15.17 | 27.38 | 49.16 |

Finally, the dynamic range $n_x$ needed to represent the input and output of the matrix lifting is investigated. It is noticed that all operations used in the RMDCT, whether the float rotation, the reversible rotation, or the FFT, are energy preserving operations. Thus, the maximum magnitude that a coefficient can reach is:

$$\max = 2^{bitdepth-1}\sqrt{2N}, \quad (60)$$

where bitdepth is the number of bits of the input audio, and N is the size of the MDCT transform. One bit (noticing $\sqrt{2}$ in (54)) is needed to further guard against overflow in the RMDCT. The dynamic range $n_x$ needed for the matrix lifting is thus:

$$n_x = bitdepth + \frac{1}{2}\log_2(2N), \quad (61)$$

Table 3 Maximum bit depth of the input audio that can be fed into an RMDCT with 32 bit integer.

| Precision $m_x$ used | 9 | 8 | 7 | 6 | 5 | 4 |
|---|---|---|---|---|---|---|
| N = 256 | 17 | 18 | 19 | 20 | 21 | 22 |
| N = 1024 | 16 | 17 | 18 | 19 | 20 | 21 |
| N = 4096 | 15 | 16 | 17 | 18 | 19 | 22 |

In Table 3, the maximum bitdepth of the input audio that can be fed into the RMDCT with 32 bit integer arithmetic implementation is listed, with different bit precision $m_x$ and RMDCT size. This table has been verified by feeding a pure sine wave of maximum magnitude into the RMDCT module, and by making sure that there is no overflow in the RMDCT module. With the RMDCT block size N being 1024, the RMDCT with 32 bit integer arithmetic may accommodate a 20-bitdepth input audio with $m_x=5$ bits left to represent the fractional part of the lifting.

2.5 Exemplary Progressive-to-lossless Audio Codec (PLEAC) with RMDCT.

Figure 12:
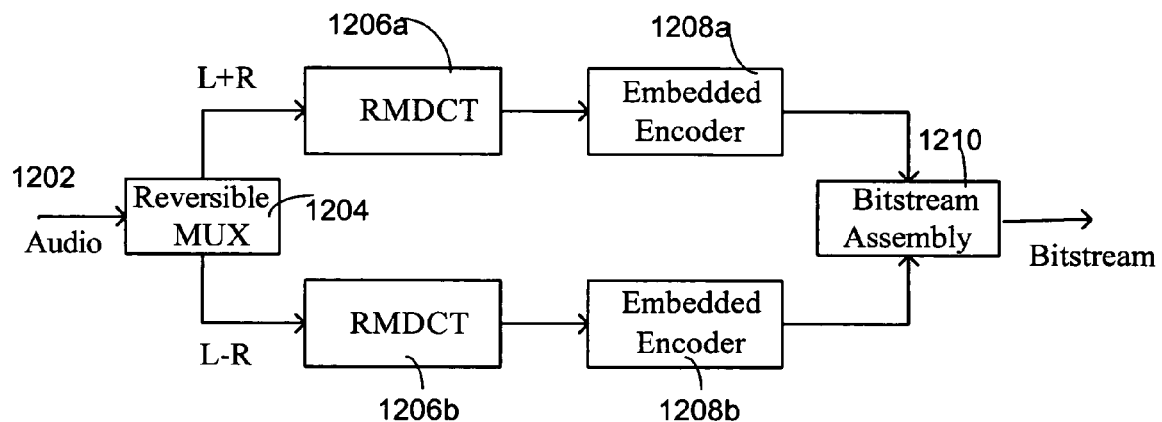
FIG. 12 depicts a progressive-to-lossless audio codec (PLEAC) encoder framework according to the present invention.

Using a RMDCT and a lossless embedded entropy coder, such as for example the one developed in [13], a progressive to lossless embedded audio coder (PLEAC) is developed in accordance with the system and method of the present invention. The encoder framework of PLEAC is shown in FIG. 12.

If the input audio 1202 is stereo, the audio waveform first goes through a reversible multiplexer (MUX) 1204, whose formulation can be shown with equation (2), and separates into the L+R and L−R components, where L and R represent the audio on the left and right channel, respectively. If the input audio is mono, the MUX simply passes through the audio. The waveform of each audio component is then transformed by an RMDCT module 1206a, 1206b with switching windows. The RMDCT window size switched between 2048 and 256 samples. After the RMDCT transform, the RMDCT coefficients of a number of consecutive windows are grouped into a timeslot. In the current configuration, a timeslot consists of 16 long windows or 128 short windows, which in either case include 32,768 samples. The coefficients in the timeslot are then entropy encoded by a highly efficient psychoacoustic embedded entropy coder 1208a, 1208b. The entropy encoder 1208a, 1208b generates a bitstream that if delivered in its entity to the decoder, may losslessly decode the input coefficients. Yet, the bitstream can be truncated at any point with graceful psychoacoustic quality degradation. Finally, a bitstream assembly 1210 module puts the bitstreams of both channels together, and forms the final compressed bitstream. A conventional sub-bitplane entropy coder and conventional bitstream assembly module may be used.

Figure 13:
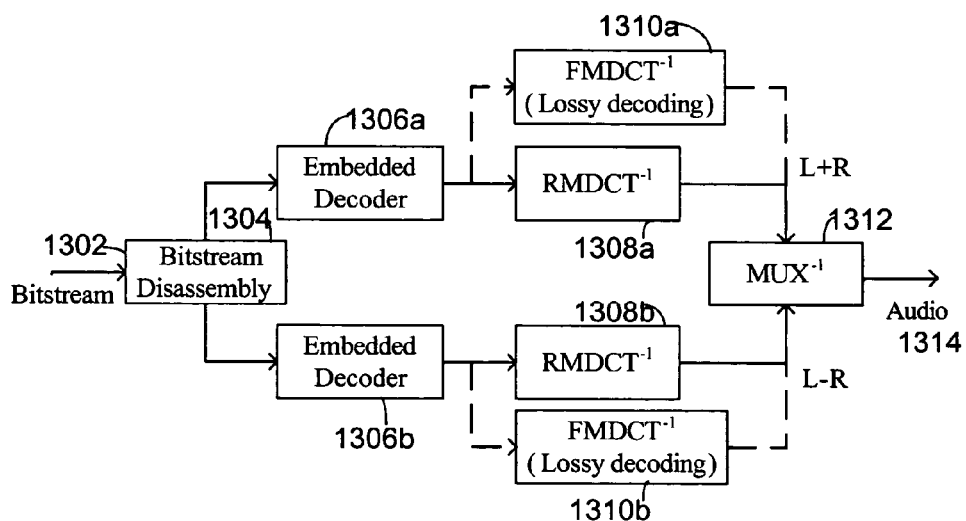
FIG. 13 depicts a PLEAC decoder framework according to the present invention.

The framework of the PLEAC decoder can be shown in FIG. 13. The received bitstream 1302 is first split into individual channel bitstreams by a disassembly module 1304. Then, it is decoded by the embedded entropy decoder 1306a, 1306b. If the decoder 1306a, 1306b finds that the received bitstream is lossless or close to lossless, i.e., the coefficients can be decoded to the last bitplane, the decoded coefficients are transformed by an inverse RMDCT module 1308a, 1308b. Otherwise, an inverse FMDCT module 1310a, 1310b is used. The rational to apply the inverse FMDCT for the lossy bitstream is that the inverse FMDCT not only has lower computational complexity, but also generates no additional quantization noise. In comparison, the inverse RMDCT generates quantization noise, which when decoded to lossless, serves to cancel the quantization noise of the encoding stage, but when decoded to lossy is just additional noise, which degrades the audio playback quality. After the inverse MDCT transform, the individual audio channels are then demultiplexed by a multiplexer 1312 to form the decoded audio waveform 1314.

Notice that the RMDCT module is used in the PLEAC encoder, whereas in the PLEAC decoder it is only used in lossless decoding. The computational penalty of RMDCT thus only resides with the PLEAC encoder and lossless PLEAC decoder.

2.6 Exemplary Methods for Implementing a RMDCT via Matrix Lifting.

Figure 14:
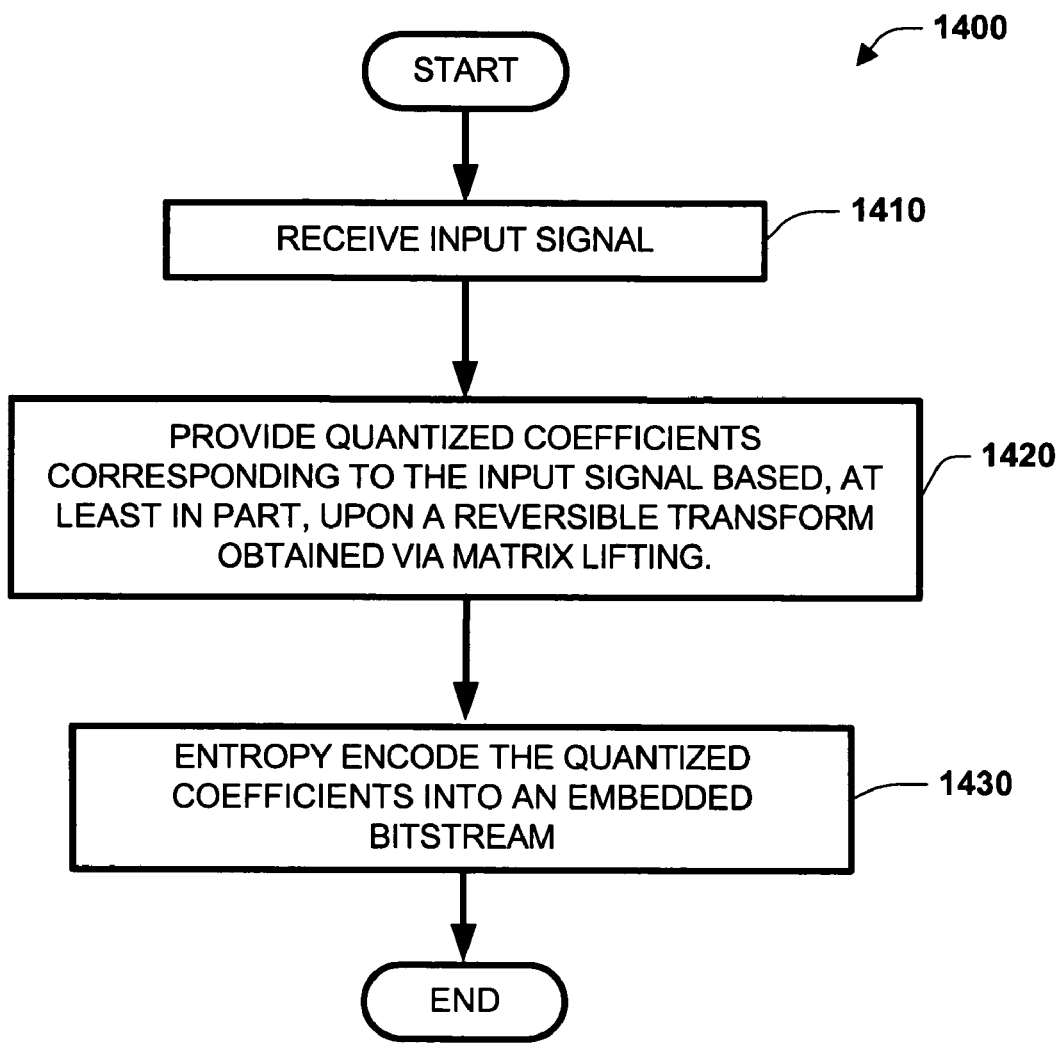
FIG. 14 depicts an exemplary method of encoding a lossless codec according to the present invention.
Figure 15:
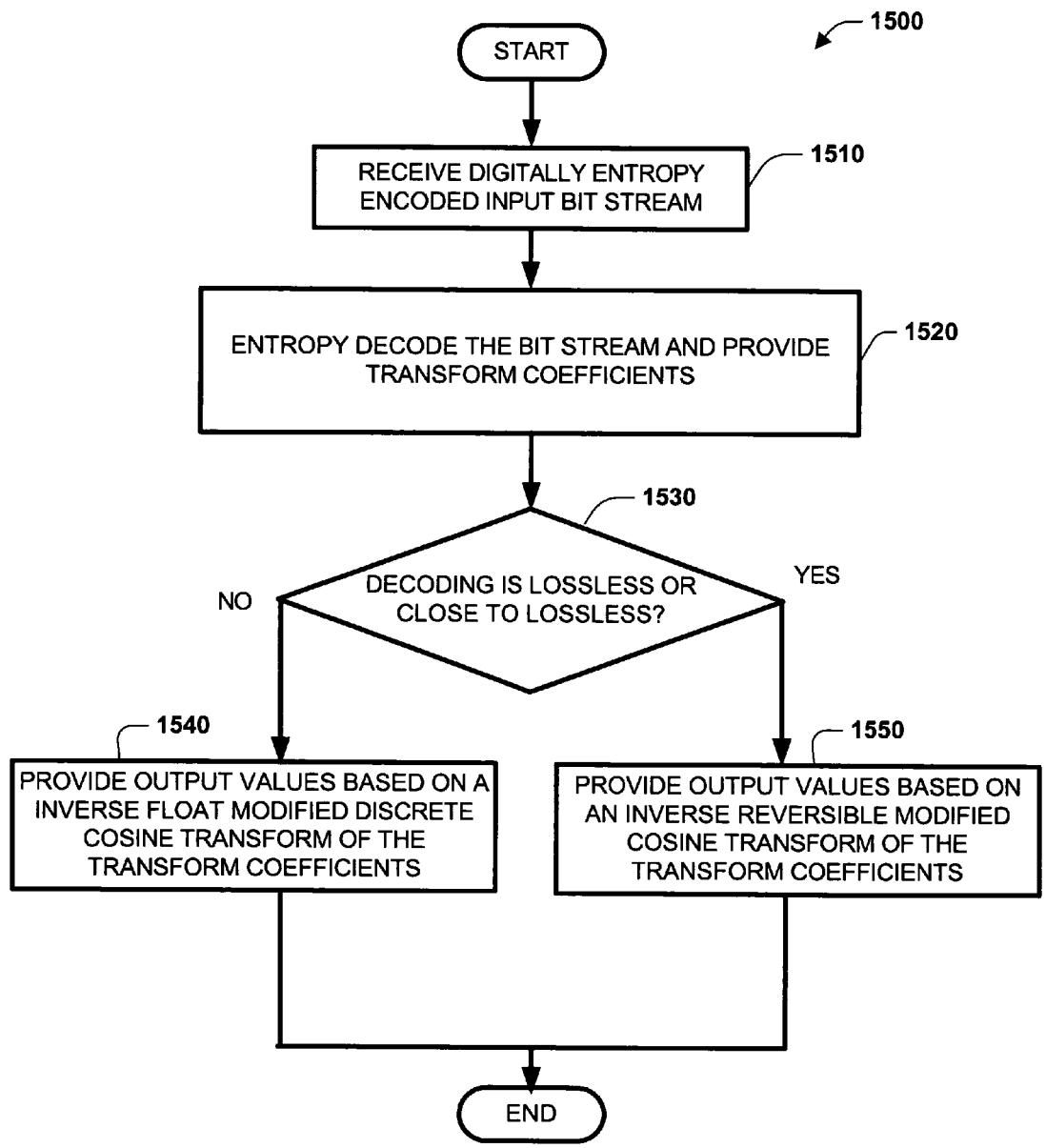
FIG. 15 depicts an exemplary method of decoding the codec that is depicted in FIG. 10 according to the present invention.

Turning briefly to FIGS. 14 and 15, methodologies that may be implemented in accordance with the present invention are illustrated. While, for purposes of simplicity of explanation, the methodologies are shown and described as a series of blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement the methodologies in accordance with the present invention.

The invention may be described in the general context of computer-executable instructions, such as program modules, executed by one or more components. Generally, program modules include routines, programs, objects, data structures, and so forth, that perform particular tasks or implement particular abstract data types. Typically the functionality of the program modules may be combined or distributed as desired in various embodiments.

Referring to FIG. 14, an exemplary method for lossless data or progressive to lossless encoding 1400 in accordance with an aspect of the present invention is illustrated. At 1410, a media input signal is received. At 1420, quantized coefficients corresponding to the input signal based, at least in part, upon a reversible modified discrete cosine transform obtained via matrix lifting is provided. For example, the reversible modified discrete cosine transform can be based upon a FFT or a fractional-shifted FFT. At 1430, the quantized coefficients are entropy encoded into an embedded bitstream, which may be truncated or reshaped later.

Next, turning to FIG. 15, an exemplary method for lossless data decoding 1500 in accordance with an aspect of the present invention is illustrated. At 1510, a digitally entropy encoded input bit stream is received. At 1520, the bit stream is entropy decoded and transform coefficients are provided. At 1530, it is tested whether the input bitstream is lossless or close to lossless. If the test is true, the output values based on an inverse reversible transform 1550 of the transform coefficients are provided. If the test is not true, the output values based on an inverse float (linear) transform 1540 of the transform coefficients are provided.

(b) Same as (a), except that the reversible rotation is implemented with only the factorization form of (8).

(c) Same as (a), except that the rounding operation is implemented as truncation towards zero.

(d) Through the reversible FFT via the matrix lifting described in Section 2.4.

With only multiple factorization reversible rotations described in Section 2.3.

All the other modules of the PLEAC codec are the same. First the output difference of the RMDCT modules versus that of the FMDCT module were compared, in terms of the mean square error (MSE), the mean absolute difference (MAD) and the peak absolute difference (PAD) calculated in equations (57)-(59). Then the lossless compression ratio of the PLEAC codecs using the specific RMDCT configuration with the state-of-the-art lossless audio compressor, the Monkey's Audio [11] were compared. Finally, the lossy coding performance was compared. The lossy compressed bitstream was derived by truncating the losslessly compressed bitstream to the bitrate of 64, 32 and 16 kbps. Then the lossy bitstream was decoded, and the decoding noise-mask-ratio (NMR) versus that of the original audio waveform (the smaller the NMR, the better the quality of the decoded audio) was measured. The NMR results were then compared with those of the lossy EAC codec, which is the PLEAC with the FMDCT module in both the encoder and the decoder. The test audio waveform was formed by concatenating the MPEG-4 sound quality assessment materials (SQAM). The aggregated comparison results are shown in Table 4 and Table 5.

TABLE 4

Quantization noise levels of different RMDCT modules.

| PLEAC w/ RMDCT versus FMDCT | a | b | c | d | e |
|---|---|---|---|---|---|
| MSE | 0.48 | 2.18 | 3.03 | 0.81 | 1.78 |
| MAD | 0.54 | 0.68 | 1.14 | 0.69 | 1.04 |
| PAD | 11.86 | 466.48 | 34.22 | 11.10 | 18.32 |

TABLE 5

Lossless and lossy compression performance of PLEAC.

| Audio codec | PLEAC w/ RMDCT a | PLEAC w/ RMDCT b | PLEAC w/ RMDCT c | PLEAC w/ RMDCT d | PLEAC w/ RMDCT e | Monkey's Audio (lossless) | EAC w/ FMDCT (lossy) |
|---|---|---|---|---|---|---|---|
| Lossless compression ratio | 2.88:1 | 2.73:1 | 2.85:1 | 2.85:1 | 2.77:1 | 2.93:1 | |
| Lossy NMR (64 kbps) | −2.18 | 4.13 | −1.60 | −1.73 | −0.06 | | −3.80 |
| Lossy NMR (32 kbps) | 2.26 | 6.69 | 2.64 | 2.48 | 3.63 | | 1.54 |
| Lossy NMR (16 kbps) | 5.41 | 8.23 | 5.63 | 5.49 | 6.11 | | 5.37 |

3.0 Experimental Results.

To evaluate the performance of the proposed RMDCT, the RMDCT modules were put into the progressive to lossless embedded audio codec (PLEAC). Then the following RMDCT configurations were compared:

(a) Through the reversible fractional-shifted FFT via the matrix lifting described in Section 2.4.

Because the configuration (b) only differs from the configuration (a) in the implementation of the reversible rotations, their difference in Table 4 demonstrates the effectiveness of the multiple factorization reversible rotations. By intelligently selecting the proper factorization form under different rotation angles, multiple factorization greatly reduces the quantization noise in the rotations. The MSE of the quantization noise is reduced by 78%. There is also a noticeable improvement in the lossless (5% less bitrate) and lossy (on average 4.5 dB better) coding performance of the PLEAC codec by replacing reversible rotation of (8) with the multiple factorization reversible rotations.

The configuration (c) only differs from the configuration (a) in the implementation of the rounding operation, with configuration (a) uses rounding towards the nearest integer, while configuration (c) uses the rounding towards zero. Though the two schemes only differ slightly in implementation, rounding towards the nearest integer is proven to be a better choice for rounding. As shown in Table 4 and 5, configuration (a) reduces the MSE by 84%, with slightly better lossless (1% less bitrate) and lossy (on average 0.4 dB better) compression performance.

From configuration (e) to (d) to (a), the matrix lifting is used to implement an ever-larger chunk of the FMDCT into a reversible module. Comparing configuration (e) (only reversible rotations) with configuration (a), which uses the matrix lifting on the fractional-shifted FFT, the quantization noise of the RMSE is reduced by 73%, while there is a reduction of 4% of lossless coding bitrate. One also observes that the NMR of lossy decoded audio improves by an average of 1.4 dB.

Overall, the RMDCT configuration with lower quantization noise leads to better lossless and lossy audio compression performance. The anomaly lies in the configuration (c). Though using truncation towards zero results in a big increase in the quantization noise in term of MSE, MAD and PAD, it does not incur as much penalty in the lossless and lossy compression performance as compared with configurations (b) and (e). This anomaly may be explained by the fact that truncation towards zero generally results in smaller entropy of the RMDCT coefficients, which mitigates some of the entropy increase caused by the rising quantization noise. Nevertheless, it is noticed that rounding towards the nearest integer still leads to superior performance in lossless and lossy compression.

It is observed that with the matrix lifting, the output of the RMDCT becomes very close to the FMDCT. The best RMDCT configuration (a), which is implemented via the reversible fractional-shifted FFT with the matrix lifting and the multiple-factorization reversible rotations, results in the MSE of the quantization noise of only 0.48. Therefore, a large number of RMDCT coefficients are just the same as the FMDCT coefficients after rounding. Incorporating the RMDCT module (a), the PLEAC codec achieves a lossless compression ratio of 2.88:1, while the state-of-the-art lossless audio compressor, the Monkey's Audio[11], achieves a lossless compression ratio of 2.93:1 of the same audio waveform. PLEAC with RMDCT is thus within 2% of the state-of-the-art lossless audio codec. Moreover, the PLEAC compressed bitstream can be scaled, from lossless all the way to very low bitrate, whereas such feature is non-existing in the Monkey's Audio. Comparing with the EAC codec, which uses FMDCT in both the encoder and decoder, PLEAC only results in an NMR loss of 0.8 dB. PLEAC is thus a fantastic all-around scalable codec from lossy all the way to lossless.

The foregoing description of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

REFERENCES

[1] D. S. Taubman and M. W. Marcellin, *JPEG 2000: image compression fundamentals, standards and practice*, Kluwer Academic Publishers.

[2] W. H. Press, S. A. Teukolsky, W. T. Vertterling and B. P. Flannery, *Numerical recipes in C++*, Cambridge University Press.

[3] K. Komatsu and K. Sezaki, "Reversible discrete cosine transform", *Proc of the IEEE International Conf on Acoustics, Speech and Signal Processing*, Vol. 3, 1998, pp. 1769-1772.

[4] R. Geiger, J. Herre, J. Koller, and K. Brandenburg, "IntMDCT —A link between perceptual and lossless audio coding," in *Proc. of ICASSP* 2002, Orlando, 2002.

[5] T. Lin, "Matrix factorization for reversible integer M-Band Wavelet Transforms", submitted to International Conf on Pattern Recognition, 2004.

[6] R. Geiger, Y. Yokotani, G. Schuller, J. Herrer, "Improved integer transforms using multi-dimensional lifting", in Proc. of ICASSP 2004, Montreal, 2004.

[7] J. Kovacevic and W. Sweldens, "Wavelet Families of Increasing Order in Arbitrary Dimensions", in IEEE Trans. On Image Processing, Vol. 9, No. 3, pp. 480-496, 2000.

[8] M. Purat, T. Liebchen, P. Noll, "Lossless transform coding of Audio Signals", 102nd AES Convention, München, 1997.

[9] T. Moriya, A. Jin, T. Mori, K. Ikeda, T. Kaneko, "Lossless scalable audio coder and quality enhancement", *Proc. of the IEEE International Conf on Acoustics, Speech and Signal Processing*, Vol. 2, 2002, pp. 1829-1832.

[10] A. Wegener, "MUSICompress: lossless, low-MIPS audio compression in software and hardware", *Proc. International Conf on Signal Processing Applications and Technology*, San Diego, Calif., 1997.

[11] Monkey's Audio, "A fast and powerful lossless audio compressor", http://www.monkeysaudio.com/ (Version 3.97).

Wherefore, what is claimed is:

1. A system for encoding a media signal comprising:
inputting a signal in the form of an integer vector; and
using a reversible transform obtained with at least one reversible matrix lifting operation to encode said signal, comprising:
splitting the integer vector into two complex integer vectors of equal size;
keeping one of the two complex integer vectors of equal size fixed;
transforming the fixed complex integer vector via a float transform to obtain a transformed vector;
rounding the transformed vector to obtain a resultant vector;
either adding the resultant vector to, or subtracting the resultant vector from, the one of the two complex integer vectors that was not kept fixed thereby generating an encoded version of the input signal in integer form.

2. The system of claim 1 wherein the reversible transform is in the form of a reversible modified discrete cosine transform.

3. The system of claim 1 wherein the reversible transform has a 2N input and a 2N output with a non-singular characterization matrix $S_{2N}$.

4. The system of claim 3 wherein the reversible transform comprises:

$$S_{2N} = P_{2N}\begin{bmatrix} I_N & \\ A_N & I_N \end{bmatrix}\begin{bmatrix} B_N & \\ & I_N \end{bmatrix}\begin{bmatrix} I_N & C_N \\ & I_N \end{bmatrix}\begin{bmatrix} I_N & \\ D_N & I_N \end{bmatrix}Q_{2N},$$

where $P_{2N}$ and $Q_{2N}$ are permutation operations, and wherein after permutation $P_{2N}$, the input signal is divided into two integer vectors X and Y, which are transformed to resultant integer vectors X' and Y' through:

$$\begin{cases} Y_1 = Y + [D_N X] \\ X_1 = X + [C_N Y] \\ X' = revB_N(X_1) \\ Y' = Y_1 + [A_N X] \end{cases},$$

where $A_N$, $C_N$ and $D_N$ are float transforms, $[D_N X]$ $[C_N Y]$ $[A_N X]$ represent vector rounding operations, and Rev $B_N$ is a reversible transform derived from reversible transform $B_N$.

5. The system of claim 4 wherein vector rounding comprises rounding the individual component of each vector.

6. The system of claim 5 wherein rounding the individual component comprises separately rounding the real and complex coefficients of the individual component.

7. The system of claim 4 wherein different forms of the reversible transform can be obtained from the linear transform $S_{2N}$ using different permutation matrices $P_{2N}$ and $Q_{2N}$, different float transforms $A_N$, $C_N$ and $D_N$, and a different reversible transform $B_N$.

8. The system of claim 1 wherein the input signal comprises an audio signal.

9. The system of claim 1 wherein the input signal comprises an image signal.

10. The system of claim 1 wherein the reversible transform is a reversible Fast Fourier Transform (FFT).

11. The system of claim 1 wherein the reversible transform is a reversible fractional-shifted Fast Fourier Transform (FFT).

12. The system of claim 8 wherein the reversible Fast Fourier Transform is a 2N-point reversible Fast Fourier Transform (FFT) $F_{2N}$ implemented via:

$$F_{2N} = P_{2N}\begin{bmatrix} I_N & \\ A_N & I_N \end{bmatrix}\begin{bmatrix} B_N & \\ & I_N \end{bmatrix}\begin{bmatrix} I_N & C_N \\ & I_N \end{bmatrix}\begin{bmatrix} I_N & \\ D_N & I_N \end{bmatrix}Q_{2N},$$

wherein $P_{2N}=I_{2N}$, $Q_{2N}=OE_{2N}$ and the other matrixes in the matrix lifting are:

$$\begin{cases} A_N = -\sqrt{2}\, F_N^T \Lambda_N(-0.5, 0) - I_N, \\ B_N = -\Lambda_N(0.5, 0) F_N F_N = -\Lambda_N(0.5, 0) T_N, \\ C_N = -\dfrac{1}{\sqrt{2}} F_N^T, \\ D_N = \left(\sqrt{2}\, I_N + F_N^T \Lambda_N(-0.5, 0)\right) F_N. \end{cases}$$

where $F_N$ is the forward FFT, $F_N^t$ is the inverse FFT and $T_N$ is a permutation matrix in the form of:

$$T_N = \begin{bmatrix} & & & 1 \\ & & 1 & \\ & \cdots & & \\ 1 & & & \end{bmatrix}.$$

13. The system of claim 11 wherein the reversible fractional-shifted transform is a 2N-point reversible fractional-shifted Fast Fourier Transform (FFT) implemented via a reversible transform $S_{2N}$ of matrix lifting followed by N reversible rotations $K_{2N}$.

14. The system of claim 13 wherein in the fractionally shifted $FFTF_{2N}(\alpha,\beta)$, with $\alpha=\beta=0.25$, the reversible rotations $K_{2N}$ take the form $$K_{2N} = \begin{bmatrix} \Lambda_N((1+\beta)/2 - \alpha, \alpha) & \\ & W_2^\beta \Lambda_N((1+\beta)/2 - \alpha, \alpha) \end{bmatrix},$$

and the reversible transform $S_{2N}$ of matrix lifting is implemented via:

$$S_{2N} = P_{2N}\begin{bmatrix} I_N & \\ A_N & I_N \end{bmatrix}\begin{bmatrix} B_N & \\ & I_N \end{bmatrix}\begin{bmatrix} I_N & C_N \\ & I_N \end{bmatrix}\begin{bmatrix} I_N & \\ D_N & I_N \end{bmatrix}Q_{2N},$$

wherein $P_{2N}=I_{2N}$, $Q_{2N}=OE_{2N}$ and the matrixes in the matrix lifting are:

$$\begin{cases} A_N = -\sqrt{2}\,\Lambda_N(-0.25, 0.25) F_N^T \Lambda_N(-0.25, 0) - I_N, \\ B_N = -R_N(0.25) = \begin{bmatrix} -1 & & & \\ & & & j \\ & & \cdots & \\ & j & & \end{bmatrix}, \\ C_N = -\dfrac{1}{\sqrt{2}}\Lambda_N(-0.25, 0.25) F_N^T \Lambda_N(0.25, 0.5), \\ D_N = \Lambda_N(-0.25, 0.25)\left(\sqrt{2} + F_N^T \Lambda_N(-0.5, 0.125)\right) F_N \Lambda_N(0.25, 0). \end{cases}$$

15. The system of claim 1 wherein the input signal is encoded in a lossless manner.

16. The system of claim 1 wherein the input signal is encoded in a progressive-to-lossless manner.

17. A computer-implemented process for compressing an audio signal comprising the process actions of, inputting an audio signal;

if the input audio signal is stereo, processing the audio signal through a reversible multiplexer (MUX) which separates into the L+R and L−R components, where L and R represent the audio on the left and right channel, respectively;

if the input audio is mono, passing the audio signal through the MUX;

transforming the waveform of each audio component by a RMDCT module;

grouping the RMDCT coefficients of a number of consecutive windows into a timeslot;

entropy encoding the coefficients in the timeslot using an embedded entropy coder; and putting the bitstreams of the left and right channels and timeslots together via a bitstream assembly module to form a final compressed bitstream.

18. The process of claim 17 wherein the RMDCT module is implemented using switching windows.

19. A progressive-to-lossless audio decoder system comprising:
a bit stream unassembler that unassembles the final compressed bitstream into bitstreams of individual channels and timeslots;
an embedded entropy decoder that digitally entropy decodes the bitstream of the individual channels and timeslots;
if the input bitstream is lossless or close to lossless, an inverse RMDCT module that transforms the decoded coefficients to waveform;
if the input bitstream is not close to lossless, an inverse FMDCT module that transforms the decoded coefficients to waveform;
if the audio signal is stereo, an inverse multiplexer that combines the L+R and L−R components.

20. The decoder of claim 19 wherein the input bitstream comprises the compressed bits of a series of bitplanes and wherein the bitstream is substantially lossless if the transform coefficients can be decoded in the last bitplane.

21. A computer-implemented process for encoding media data, comprising the process actions of:
using a reversible transform component that receives an input signal and provides an output of quantized coefficients corresponding to the input signal, the output of quantized coefficients being based, at least in part, upon a reversible transform obtained via matrix lifting, wherein matrix lifting comprises
inputting the signal in the form of an integer vector;
splitting the integer vector into two complex integer vectors of equal size;
keeping one of the two complex integer vectors of equal size fixed;
transforming the fixed complex integer vector via a float transform to obtain a transformed vector;
rounding the transformed vector to obtain a resultant vector;
either adding the resultant vector to, or subtracting the resultant vector from, the one of the two complex integer vectors that was not kept fixed; and,
using an entropy encoder component that digitally entropy encodes the quantized coefficients.

22. The computer-implemented process of claim 21 wherein the reversible transform obtained via matrix lifting comprises at least one float Fast Fourier transform.

23. The computer-implemented process of claim 21 wherein the Fast Fourier Transform is a $2^N$ point FFT implemented by,
for 1 to N,
performing a first butterfly operation;
performing a second butterfly operation to obtain an interim result;
dividing the interim result by 2; and
dividing the interim result by $2^{1/2}$ operation if the number of butterfly stages N is odd.

24. The computer-implemented process of claim 22 wherein the matrix lifting is implemented via fixed float representation, comprising:
converting the input signal to a fixed precision float representation by left shifting a fixed number of bits;
performing a fixed precision float transform using previously-stored fixed precision float coefficients;
outputting a fixed precision float point result; and
rounding the fixed precision float point result to integer values by right shifting a fixed number of bits and adding the carryover bit shifted out.

25. The computer-implemented process of claim 21 wherein said process actions are stored on a computer-readable medium.

26. The computer-implemented process of claim 21 wherein the reversible transform is in the form of a reversible modified discrete cosine transform.

27. The computer-implemented process of claim 21 wherein the reversible transform has a 2N input and a 2N output with a non-singular characterization matrix $S_{2N}$.

28. The computer-implemented process of claim 27 wherein the reversible transform comprises:

$$S_{2N} = P_{2N} \begin{bmatrix} I_N & \\ A_N & I_N \end{bmatrix} \begin{bmatrix} B_N & \\ & I_N \end{bmatrix} \begin{bmatrix} I_N & C_N \\ & I_N \end{bmatrix} \begin{bmatrix} I_N & \\ D_N & I_N \end{bmatrix} Q_{2N},$$

where $P_{2N}$ and $Q_{2N}$ are permutation operations,
and wherein after permutation $P_{2N}$, the input signal is divided into two integer vectors X and Y, which are transformed to resultant integer vectors X' and Y' through:

$$\begin{cases} Y_1 = Y + [D_N X] \\ X_1 = X + [C_N Y] \\ X' = revB_N(X_1) \\ Y' = Y_1 + [A_N X] \end{cases},$$

where $A_N$, $C_N$ and $D_N$ are float transforms, $[D_N X]$ $[C_N Y]$ $[A_N X]$ represent vector rounding operations, and Rev $B_N$ is a reversible transform derived from reversible transform $B_N$.

29. The computer-implemented process of claim 28 wherein vector rounding is obtained by separately rounding the real and complex coefficient of the individual component of the vector.

30. The computer-implemented process of claim 28 wherein different forms of the reversible transform can be obtained from the linear transform $S_{2N}$ using different permutation matrixes $P_{2N}$ and $Q_{2N}$, different float transforms $A_N$, $C_N$ and $D_N$, and a different reversible transform $B_N$.

31. The computer-implemented process of claim 21 wherein the input signal comprises an audio signal.

32. The computer-implemented process of claim 21 wherein the input signal comprises an image signal.

33. The computer-implemented process of claim 21 wherein the reversible transform is a reversible Fast Fourier Transform (FFT).

34. The computer-implemented process of claim 21 wherein the reversible transform is a reversible fractional-shifted Fast Fourier Transform (FFT).

35. The computer-implemented process of claim 33 wherein the reversible Fast Fourier Transform is a 2N-point reversible Fast Fourier Transform (FFT) $F_{2N}$ implemented via:

$$F_{2N} = P_{2N} \begin{bmatrix} I_N & \\ A_N & I_N \end{bmatrix} \begin{bmatrix} B_N & \\ & I_N \end{bmatrix} \begin{bmatrix} I_N & C_N \\ & I_N \end{bmatrix} \begin{bmatrix} I_N & \\ D_N & I_N \end{bmatrix} Q_{2N},$$

wherein $P_{2N}=I_{2N}$, $Q_{2N}=OE_{2N}$ and the other matrixes in the matrix lifting are:

$$\begin{cases} A_N = -\sqrt{2}\, F_N^T \Lambda_N(-0.5, 0) - I_N, \\ B_N = -\Lambda_N(0.5, 0)F_N F_N = -\Lambda_N(0.5, 0)T_N, \\ C_N = -\dfrac{1}{\sqrt{2}} F_N^T, \\ D_N = \left(\sqrt{2}\, I_N + F_N^T \Lambda_N(-0.5, 0)\right) F_N. \end{cases}$$

where $F_N$ is the forward FFT, $F_N^t$ is the inverse FFT and $T_N$ is a permutation matrix in the form of:

$$T_N = \begin{bmatrix} & & & 1 \\ & & 1 & \\ & \cdot^{\cdot^{\cdot}} & & \\ 1 & & & \end{bmatrix}.$$

36. The computer-implemented process of claim 33 wherein the reversible fractional-shifted transform is a 2N-point reversible fractional-shifted Fast Fourier Transform (FFT) implemented via a reversible transform $S_{2N}$ of matrix lifting followed by N reversible rotations $K_{2N}$.

37. The computer-implemented of claim 36 wherein in the fractionally shifted FFT $F_{2N}(\alpha,\beta)$, with $\alpha=\beta=0.25$, the reversible rotations $K_{2N}$ take the form $$K_{2N} = \begin{bmatrix} \Lambda_N((1+\beta)/2 - \alpha, \alpha) & \\ & W_2^\beta \Lambda_N((1+\beta)/2 - \alpha, \alpha) \end{bmatrix},$$

and the reversible transform $S_{2N}$ of matrix lifting is implemented via:

$$S_{2N} = P_{2N} \begin{bmatrix} I_N & \\ A_N & I_N \end{bmatrix} \begin{bmatrix} B_N & \\ & I_N \end{bmatrix} \begin{bmatrix} I_N & C_N \\ & I_N \end{bmatrix} \begin{bmatrix} I_N & \\ D_N & I_N \end{bmatrix} Q_{2N},$$

wherein $P_{2N}=I_{2N}$, $Q_{2N}=OE_{2N}$ and the matrixes in the matrix lifting are:

$$\begin{cases} A_N = -\sqrt{2}\,\Lambda_N(-0.25, 0.25) F_N^T \Lambda_N(-0.25, 0) - I_N, \\ B_N = -R_N(0.25) = \begin{bmatrix} -1 & & & \\ & j & & \\ & & \ddots & \\ & & & j \end{bmatrix}, \\ C_N = -\dfrac{1}{\sqrt{2}} \Lambda_N(-0.25, 0.25) F_N^T \Lambda_N(0.25, 0.5), \\ D_N = \Lambda_N(-0.25, 0.25)\left(\sqrt{2} + F_N^T \Lambda_N(-0.5, 0.125)\right) F_N \Lambda_N(0.25, 0). \end{cases}$$

38. The computer-implemented process of claim 21 wherein the input signal is encoded in a lossless manner.

39. The computer-implemented process of claim 21 wherein the input signal is encoded in a progressive-to-lossless manner.

* * * * *